US008362931B2

(12) United States Patent
Hunt et al.

(10) Patent No.: US 8,362,931 B2
(45) Date of Patent: Jan. 29, 2013

(54) COMPRESSION AND DECOMPRESSION OF MASS SPECTROMETRY DATA

(75) Inventors: Brandon T. Hunt, Bellevue, WA (US); Andrey Y. Bondarenko, Bellevue, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 12/955,905

(22) Filed: Nov. 30, 2010

(65) Prior Publication Data

US 2012/0133532 A1     May 31, 2012

(51) Int. Cl.
*H03M 7/30*     (2006.01)
(52) U.S. Cl. ............................................ 341/76; 341/51
(58) Field of Classification Search .................. 341/50, 341/51, 106, 76, 87; 702/20, 66
See application file for complete search history.

(56) References Cited

U.S. PATENT DOCUMENTS

| 5,428,357 | A | 6/1995 | Haab et al. |
| 5,995,989 | A | 11/1999 | Gedcke et al. |
| 6,378,007 | B1 * | 4/2002 | Southwell ........................ 710/1 |
| 6,787,761 | B2 | 9/2004 | Hastings |
| 7,249,153 | B2 | 7/2007 | Cheng et al. |
| 7,342,965 | B2 * | 3/2008 | Lainema ................... 375/240.23 |
| 7,638,764 | B2 | 12/2009 | Ivosev |
| 8,004,429 | B2 * | 8/2011 | Oh et al. .......................... 341/50 |
| 2004/0037461 | A1 * | 2/2004 | Lainema ........................ 382/166 |
| 2007/0041661 | A1 * | 2/2007 | Hung et al. .................... 382/295 |
| 2007/0143319 | A1 | 6/2007 | Malek et al. |
| 2011/0228970 | A1 * | 9/2011 | Kajihara et al. .............. 382/100 |

OTHER PUBLICATIONS

Blanckenburg, et al., "'Lossless' Compression of High Resolution Mass Spectra of Small Molecules," retrieved at <<http://www.ncbi.nlm.nih.gov/pmc/articles/PMC2899016/>>, Metabolomics, Mar. 7, 2010, 9 pages.
Miguel, et al., "Near-Lossless Compression of Mass Spectra for Proteomics," retrieved at <<http://ispl.korea.ac.kr/conference/ICASSP2007/pdfs/0100369.pdf>>, ICASSP, 2007, pp. 269-372.
Corral, et al., "Hardware-Accelerated 3D Visualization of Mass Spectrometry Data," retrieved at <<http://ieeexplore.ieee.org/stamp/stamp.jsp?tp=arnumber=1532827&userType=inst >>, IEEE Visualization, Oct. 2005, pp. 439-446.
"Rosetta Elucidator System," retrieved at http://www.rosettabio.com/products/elucidator>>, Rosetta Inpharmatics LLC, retrieved on Nov. 29, 2010, 2 pages.

* cited by examiner

*Primary Examiner* — Peguy Jean Pierre

(57) ABSTRACT

Functionality is described for compressing and decompressing mass spectrometry data, therefore making it easier to store, retrieve, transfer, and process the mass spectrometry data. The functionality operates by mapping data values (e.g., mass-to-charge data values or intensity data values) into index values, and then mapping the index values into delta values. The functionality then uses an encoding algorithm (such as a coding tree) to represent the delta values in compressed form. In a decoding stage, the functionality can interpret each encoded delta value with reference to a chain of preceding delta values, which ultimately link to an initial data value that is expressed in non-relative form. In one implementation, the functionality can define multiple such initial data values which correspond to multiple access points in a stream of compressed mass spectrometry data.

18 Claims, 19 Drawing Sheets

FOR A PARTICULAR RT = RT$_i$

MASS-TO-CHARGE (m/z)

... | 742.1221 | 742.1235 | 801.7411 | 801.7423 | 801.7429 | 801.7433 | ...

... | 1023.32 | 4977.21 | 5661.98 | 16721.23 | 49188.27 | 39332.91 | ...

INTENSITY

COMPRESSION AND DECOMPRESSION OF MASS SPECTROMETRY DATA

BACKGROUND

Mass spectrometry is a commonly-used technique to identify the chemical substances that are present in a sample of material. In this technique, a mass spectrometer breaks the sample up into charged particles by ionizing the sample. The mass spectrometer then identifies the ratio of mass to charge for each particle. The mass spectrometer also measures the amount of material associated with each particle. The amount of material thus determined relates to an intensity dimension of the measurement.

More specifically, in one approach, each data point (or data cell) measured by the mass spectrometer comprises three data values: a retention time (RT) data value, a mass-to-charge (m/z) data value, and an intensity (I) data value. The RT data value relates to a time at which the mass spectrometer makes a plurality of mass-to-charge measurements and intensity measurements. The m/z data value refers to an individual m/z measurement for a particular RT data value. And the intensity data value refers to an individual intensity measurement for a particular RT data value and m/z data value. Upon recording plural such data points, the mass spectrometer can construct liquid chromatography-mass spectrometry (LC/MS) spectra. The LC/MS spectra can be represented by a first axis corresponding to the retention time, a second axis corresponding to the mass-to-charge ratio, and a third axis corresponding to intensity. Such LC/MS spectra typically reveal a few dramatic intensity spikes in an otherwise baseline of low-level noise.

A typical mass spectrometer produces a large quantity of the above-described mass spectrometry data. For instance, a mass spectrometer can easily produce a volume of mass spectrometry data in the gigabyte range for a single measurement run. This factor introduces various challenges in the effective manipulation of the data. Such manipulation encompasses the storage, retrieval, transfer, and processing of the mass spectrometry data.

Future increases in the precision and efficiency of mass spectrometers can be expected to compound the above-noted challenges, e.g., by potentially providing the capacity to generate even greater volumes of mass spectrometry data over decreasing spans of time.

SUMMARY

A compression module is described which compresses mass spectrometry data. The compression module operates by receiving uncompressed mass spectrometry data values, comprising retention time (RT) data values, mass-to-charge (m/z) data values, and intensity data values. The compression module can compress each component of the mass spectrometry data to produce, respectively, compressed RT data values, compressed (m/z) data values, and compressed intensity data values.

According to one illustrative feature, the compression module can compress the m/z data values by first mapping the m/z data values into m/z index values. The m/z index values identify respective locations of the m/z data values in a mass-to-charge master table. The compression module can then form m/z delta values that identify differences between respective neighboring pairs of mass-to-charge index values. Finally, the compression module can use an encoding algorithm to encode the m/z delta values in compressed form, to provide the compressed m/z data values.

According to another illustrative feature, the compression module can form a stream of compressed m/z delta values, which follow an initial m/z data value that is expressed in non-relative form (that as, expressed as an index value rather than a delta value). In a decoding stage, each encoded m/z delta value is interpreted with reference to a chain of preceding m/z values, which ultimately link back to an initial m/z data value.

According to another illustrative feature, without limitation, the encoding algorithm uses a coding tree to compress the m/z delta values, e.g., by mapping the delta values into reduced-size code words that represent the m/z delta values. Other implementations can adopt other respective encoding algorithms.

According to another illustrative feature, the compression module can compress the intensity data values in the same manner specified above with respect to the m/z data values. Or the compression module can directly form and compress intensity index values (that is, without forming and compressing intensity delta values).

According to another illustrative feature, prior to compression, a grid determination module can be used to define a reference grid on which to place intensity data values. The grid determination module defines the reference grid in a dynamic manner to account for the rate of change of intensity values as a function of intensity level.

A decompression module is also described which decodes compressed mass spectrometry data. The decompression module operates by receiving a lookup request. Based on that request, the decompression module determines at least one access point. The access point defines a point at which decoding of a stream of (encoded) data values commences. The decoding decompression module then begins decoding the data values, starting at the access point, using an appropriate decoding algorithm.

The above approach can be manifested in various types of systems, components, methods, computer readable media, data structures, articles of manufacture, and so on.

This Summary is provided to introduce a selection of concepts in a simplified form; these concepts are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 10 also shows a decompression module for decoding the compressed spectrometry data.

The same numbers are used throughout the disclosure and figures to reference like components and features. Series 100 numbers refer to features originally found in FIG. 1, series 200 numbers refer to features originally found in FIG. 2, series 300 numbers refer to features originally found in FIG. 3, and so on.

DETAILED DESCRIPTION

This disclosure is organized as follows. Section A describes an illustrative system for compressing and decompressing mass spectrometry data. Section B describes illustrative methods which explain the operation of the system of Section A. Section C describes illustrative processing functionality that can be used to implement any aspect of the features described in Sections A and B.

Figure 22:
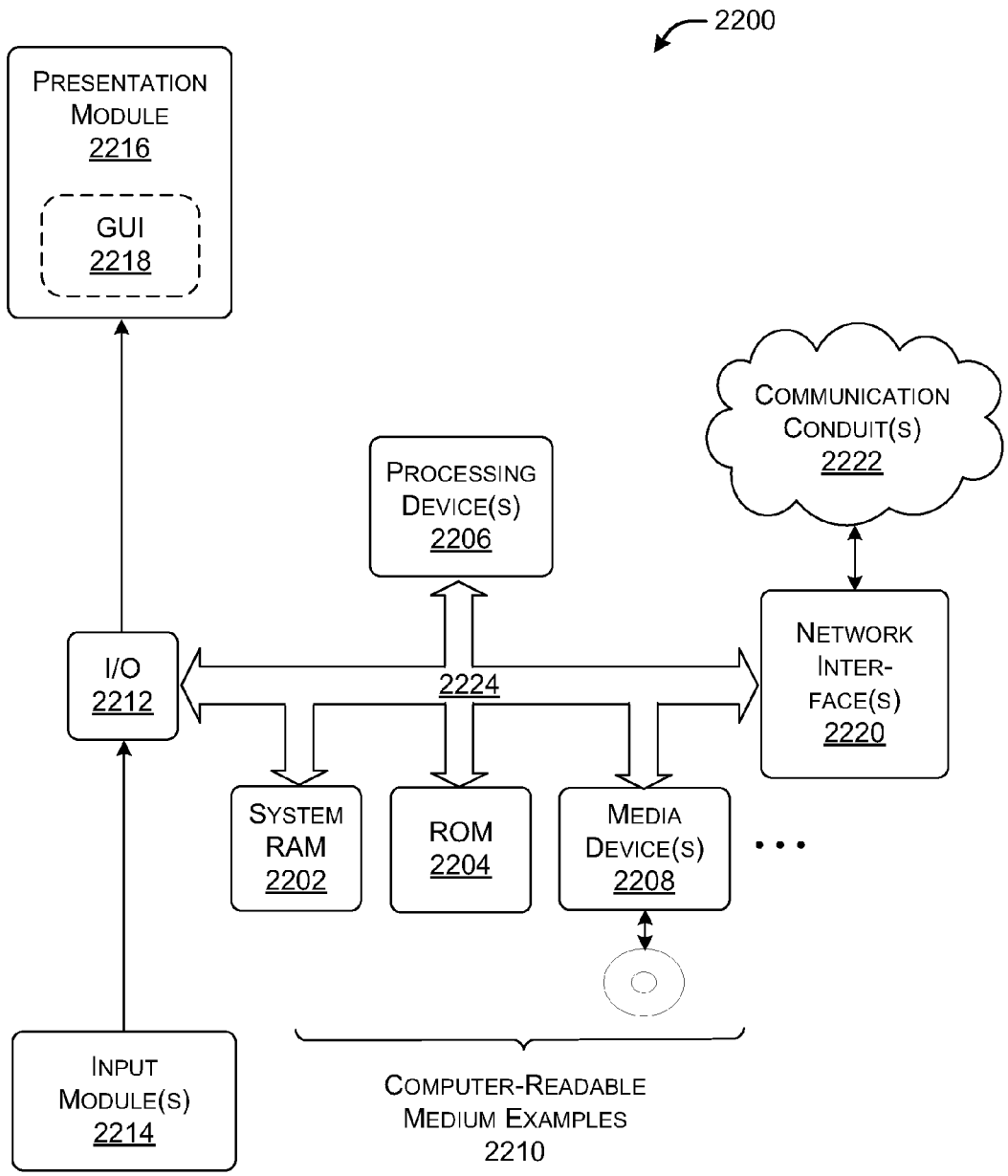
FIG. 22 shows illustrative processing functionality that can be used to implement any aspect of the features shown in the foregoing drawings.

As a preliminary matter, some of the figures describe concepts in the context of one or more structural components, variously referred to as functionality, modules, features, elements, etc. The various components shown in the figures can be implemented in any manner by any physical and tangible mechanisms (e.g., using hardware, software, firmware, etc., or any combination thereof). In one case, the illustrated separation of various components in the figures into distinct units may reflect the use of corresponding distinct physical and tangible components in an actual implementation. Alternatively, or in addition, any single component illustrated in the figures may be implemented by plural actual physical components. Alternatively, or in addition, the depiction of any two or more separate components in the figures may reflect different functions performed by a single actual physical component. FIG. 22, to be discussed in turn, provides additional details regarding one illustrative physical implementation of the functions shown in the figures.

Other figures describe the concepts in flowchart form. In this form, certain operations are described as constituting distinct blocks performed in a certain order. Such implementations are illustrative and non-limiting. Certain blocks described herein can be grouped together and performed in a single operation, certain blocks can be broken apart into plural component blocks, and certain blocks can be performed in an order that differs from that which is illustrated herein (including a parallel manner of performing the blocks). The blocks shown in the flowcharts can be implemented in any manner by any physical and tangible mechanisms (e.g., using hardware, software, firmware, etc., or any combination thereof).

As to terminology, the phrase "configured to" encompasses any way that any kind of physical and tangible functionality can be constructed to perform an identified operation. The functionality can be configured to perform an operation using, for instance, software, hardware, firmware, etc., and/or any combination thereof.

The term "logic" encompasses any physical and tangible functionality for performing a task. For instance, each operation illustrated in the flowcharts corresponds to a logic component for performing that operation. An operation can be performed using, for instance, software, hardware, firmware, etc., and/or any combination thereof. When implemented by a computing system, a logic component represents an electrical component that is a physical part of the computing system, however implemented.

The following explanation may identify one or more features as "optional." This type of statement is not to be interpreted as an exhaustive indication of features that may be considered optional; that is, other features can be considered as optional, although not expressly identified in the text. Similarly, the explanation may indicate that one or more features can be implemented in the plural (that is, by providing more than one of the features). This statement is not be interpreted as an exhaustive indication of features that can be duplicated. Finally, the terms "exemplary" or "illustrative" refer to one implementation among potentially many implementations.

A. Illustrative Compression and Decompression Functionality

Figure 1:
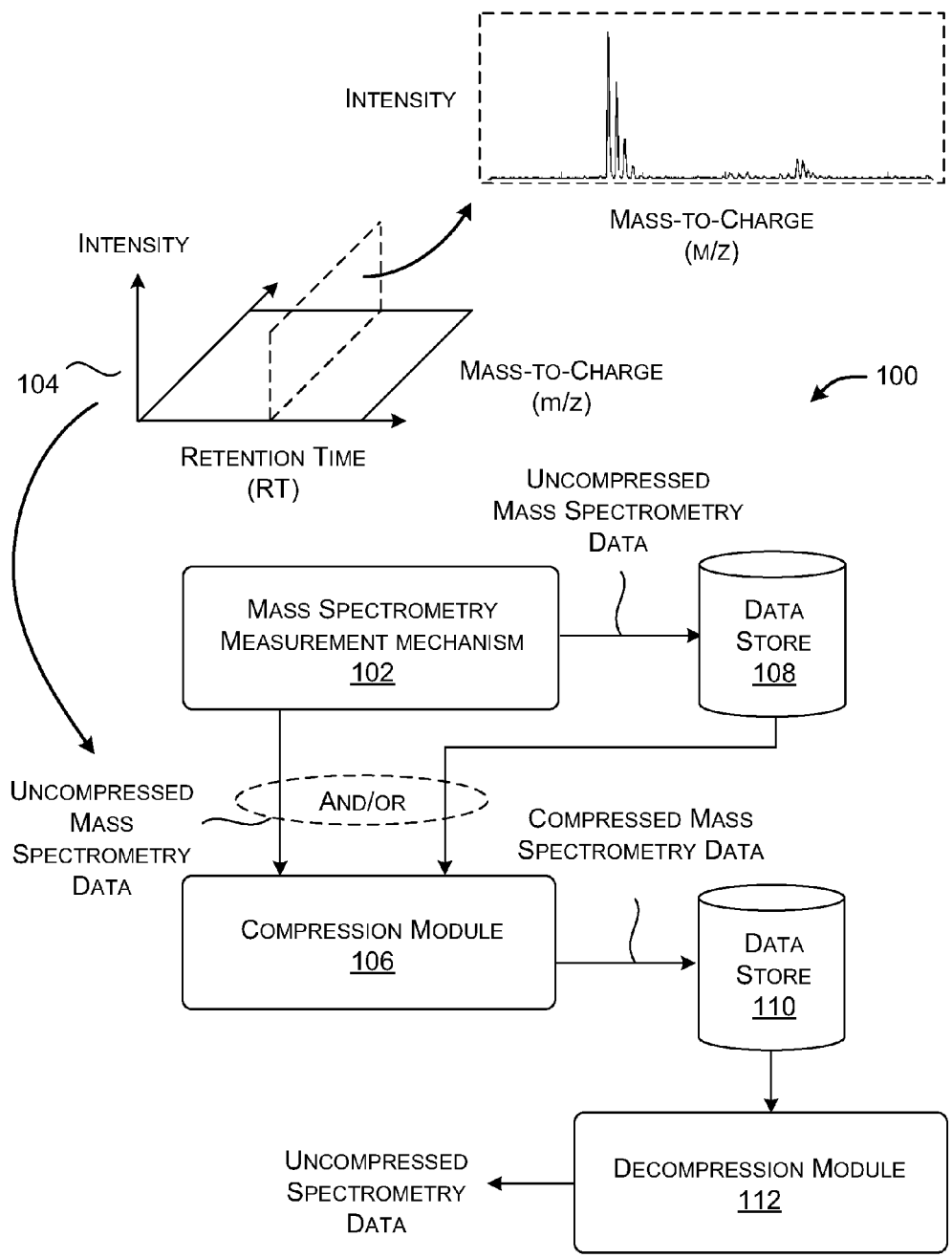
FIG. 1 shows an overview of an illustrative environment for compressing and decompressing mass spectrometry data. The environment includes a compression module and a decompression module.

FIG. 1 shows an illustrative environment 100 for compressing and decompressing mass spectrometry data. The environment 100 includes a mass spectrometry measurement mechanism 102 for generating uncompressed mass spectrometry data. For example, in some implementations, the mass spectrometry measurement mechanism 102 can correspond to any commercially available mass spectrometer machine. As used herein, the phrase "uncompressed mass spectrometry data" is a relative term; it means that the data is uncompressed relative to the types of compression which are subsequently applied to it, and described herein. In some cases, for example, the uncompressed mass spectrometry data may have already undergone some form of compression, e.g., performed by the mass spectrometry measurement mechanism 102 itself.

FIG. 1 shows an example of LC/MS spectra 104 that can be used to visualize the uncompressed mass spectrometry data produced by the mass spectrometer measurement mechanism 102. Each data point (or data cell) in the LC/MS spectra 104 may be described using three values: a retention time (RT) data value, a mass-to-charge (m/z) data value, and an intensity data value. As set forth in the Background section, the retention time data value relates to the time at which a measurement was taken. The mass-to-charge data value corresponds to the mass-to-charge dimension of the measurement. And the intensity data value corresponds to the intensity dimension of the measurement, e.g., relating to an amount of ionized material that has been detected for a particular RT data value and a particular m/z data value. As shown in FIG. 1, any particular slice through the LC/MS spectra 104 typically exhibits a few dramatic spikes against a background of generally low-level noise.

Figures 2, 3:
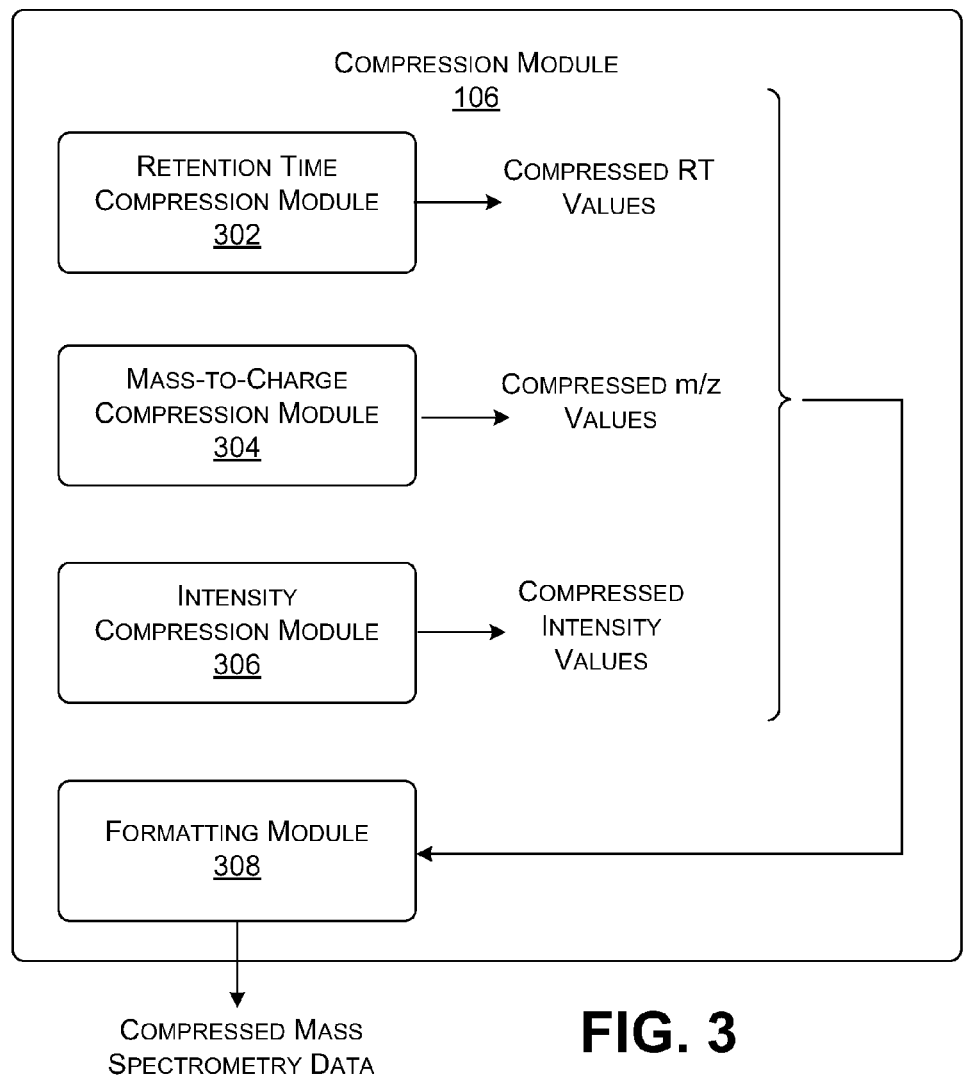
FIG. 2 shows a sample of mass spectrometry data that may be compressed by the compression module of FIG. 1.
FIG. 3 shows an overview of an illustrative compression module that may be used in the system of FIG. 1.

Jumping ahead momentarily in the sequence of figures, FIG. 2 shows a small sample of the uncompressed mass spectrometry data. For each retention time data value, the mass spectrometry data comprises an array of m/z data values and an array of intensity data values. In other words, that subset of data values corresponds to a slice in the LC/MS spectra 104. In one implementation, the uncompressed data values (e.g., either the m/z data values or the intensity data values, or both) can be represented as multi-byte floats. When considered in aggregate, the amount of data in LC/MS spectra is very large in size, e.g., potentially in the gigabyte range.

A compression module 106 operates to compress the mass spectrometry data to produce compressed mass spectrometry data. In one case, the compression module 106 can receive the uncompressed mass spectrometry data directly from the mass spectrometry measurement mechanism 102. In another case, the mass spectrometry measurement mechanism 102 can store the uncompressed mass spectrometry data in one or more data stores 108 (referred to in the singular below for brevity). The compression module 106 can retrieve the uncompressed mass spectrometry data from this data store 108.

In one case, the compression module 106 represents a separate component with respect to the mass spectrometry measurement mechanism 102. In another case, the compression module 106 represents an integral component of the mass spectrometry measurement mechanism 102. In a third case, at least part of the compression module 106 is integrated with the mass spectrometry measurement mechanism 102, and another part is separate.

The compression module 106 produces compressed mass spectrometry data. The compression module 106 can forward the compressed mass spectrometry data to one or more data stores 110 (referred to in the singular below for brevity). The data store 110 can be local or remote with respect to the compression module 106.

At any time thereafter, a decompression module 112 may retrieve the compressed mass spectrometry data from the data store 110. The decompression module 112 can then decode the compressed data values contained therein to reconstitute the original mass spectrometry data (that is, the mass spectrometry data that was fed into the compression module 106). The decompression module 112 can be disposed at any location relative to the compression module 106, e.g., at a different site or at the same site.

The compression of mass spectrometry data has one or more benefits. In general, the compression can reduce the amount of time and equipment resources that are required to store, retrieve, transfer, and process the mass spectrometry data.

FIG. 3 shows a high-level overview of the components of the compression module 106. The compression module 106 includes sub-modules for compressing individual components of the mass spectrometry data. For example, the compression module 106 includes a retention time compression module 302 for compressing the RT data values, a mass-to-charge compression module 304 for compressing the m/z data values, and an intensity compression module 306 for compressing the intensity data values. A formatting module 308 assembles the compressed RT data values, the compressed m/z data values, and the compressed intensity data values to constitute the compressed mass spectrometry data (in a manner to be described below).

Figure 4:
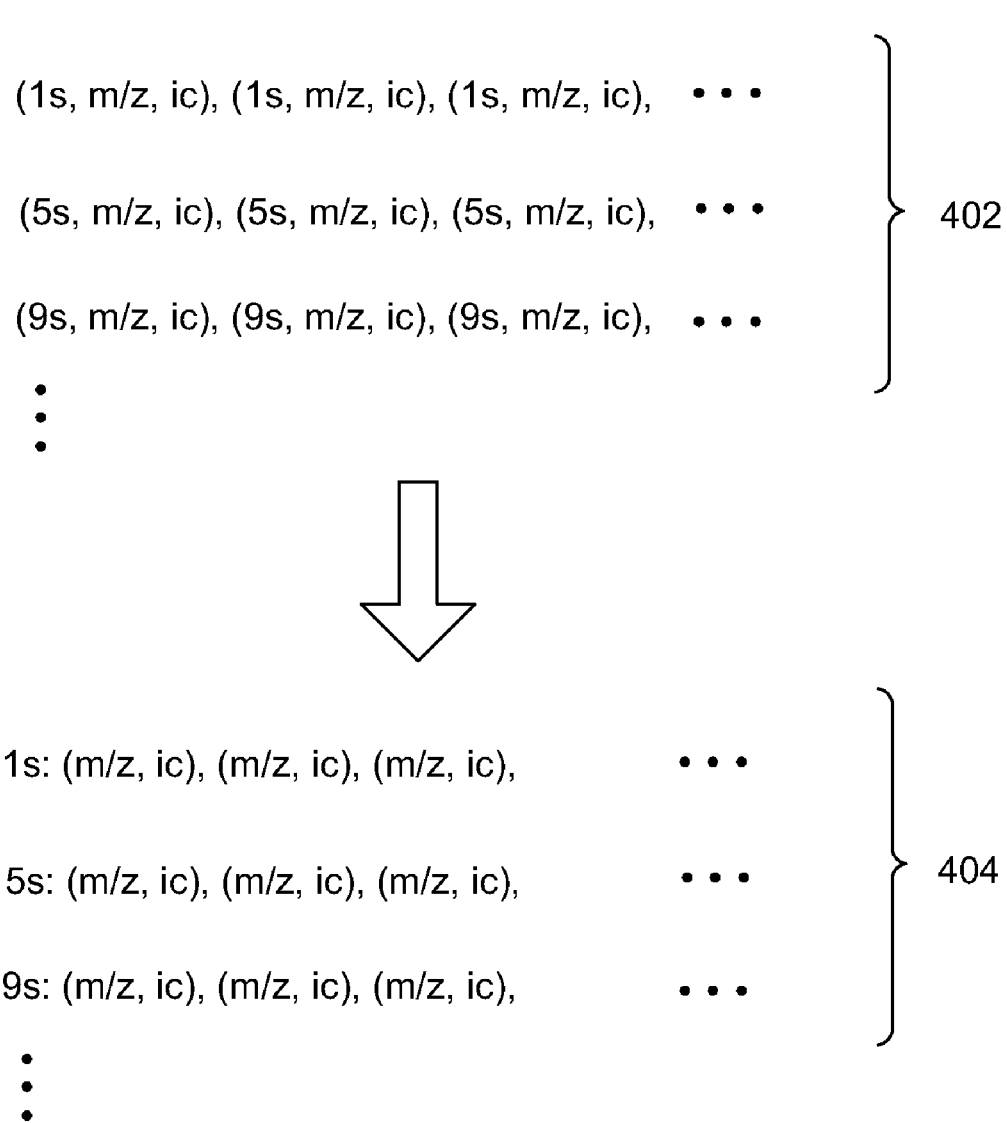
FIG. 4 shows an example of a technique for compressing retention time (RT) data values using the compression module of FIG. 3.

FIG. 4 shows an example which demonstrates one manner of operation of the retention time compression module 302. In an uncompressed state 402, each data point is represented by a complete triple of data values, including an RT data value, an m/z data value, and an intensity data value. The retention time compression module 302 eliminates redundant copies of the RT data values. For example in a compressed state 404, a group of m/z data values and intensity values that are measured at a particular retention time are associated with a single expression of the RT data value.

FIGS. 5-10 next describe functionality for implementing both the mass-to-charge compression module 304 and the intensity compression module 306. To facilitate and simplify explanation, however, these figures will first be described in the context of the compression of m/z data values by the mass-to-charge compression module 304.

To begin with, in a first scenario, the mass spectrometry mechanism 102 can produce m/z data values that are already placed with respect to a suitable reference grid. As used herein, the term reference grid refers to a quantization scheme by which a potentially continuous data space is represented as discrete data values. In another scenario, the mass spectrometry mechanism 102 produces m/z data values that are not yet placed with respect to a suitable reference grid. For instance, the m/z data values may not yet be represented by a discrete reference grid, or the m/z data values may be represented by a discrete reference grid that is deemed unsatisfactory for one more reasons, e.g., because the existing reference grid expressed a quantization scheme does not provide a desired initial level of compression because it is too finely graduated or is otherwise not appropriately graduated.

In the latter case, the mass-to-charge compression module 304 includes an optional placement module 502 for placing the m/z data values provided by the mass spectrometry mechanism 102 onto a suitable reference grid. More specifically, the placement module 502 includes a grid determination module 504 for defining a suitable reference grid (e.g., in the manner to be described in Section B). The placement module 502 also includes an interpolation module 506 for placing the original m/z data values onto the new reference grid, e.g., by performing interpolation on the original m/z data values to "snap" them onto the new reference grid.

The mass-to-charge compression module 304 also provides a coding module 508 for compressing the m/z data values (after these m/z data values have been placed on a suitable reference grid, if not already placed on a suitable reference grid). By way of overview, the coding module 508 operates by converting the m/z data values to index values which point into a master table 510. The coding module 508 then forms delta values that reflect differences among neighboring pairs of the index values. The coding module 508 then encodes the delta values using an encoding algorithm, and thereby compresses the delta values.

More specifically, a master table determination module 512 sorts all of the m/z data values in order (from smallest to largest or vice versa) to form the master table 510. The indices of this master table 510, referred to as index values herein, point to the locations of respective m/z data values in the master table 510.

A delta formation module 514 then represents a stream of m/z data values that have been measured with corresponding index values that point into the master table 510. The delta formation module 514 then computes pair-wise differences among neighboring pairs of the index values to form a stream of delta values.

A delta encoding module 516 translates the stream of delta values to compressed m/z values using a selected encoding algorithm, such as a coding tree. That is, the coding tree can be used to encode data, and then, in a subsequent decoding stage, can be used to decode the data. An algorithm selection module 518 selects an appropriate encoding algorithm to provide effective compression of a set of m/z delta values.

The operation of the modules described above will be clarified by way of representative examples, which follow. First, consider FIG. 6, which shows a stream of m/z index values and a corresponding stream of delta values. As described above, the index values points to individual locations in the master table 510. For example, the first index value (with value 121) points to a location in the master table pointed to by value 121. The delta values are formed by taking the difference between each neighboring pair of index values. For example, the second index value is 122, which means that the second delta value is 1, since there is a difference of one index value between the first index value (of value 121) and the second index value (of value 122). Note, from a high-level perspective, that the stream of delta values includes a large number of small changes (delta values), along with a few instances of larger changes. The delta encoding module 516 leverages the prevalence of small delta values in the stream of delta values by representing these common changes with a small number of bits (compared to the larger changes).

Figure 7:
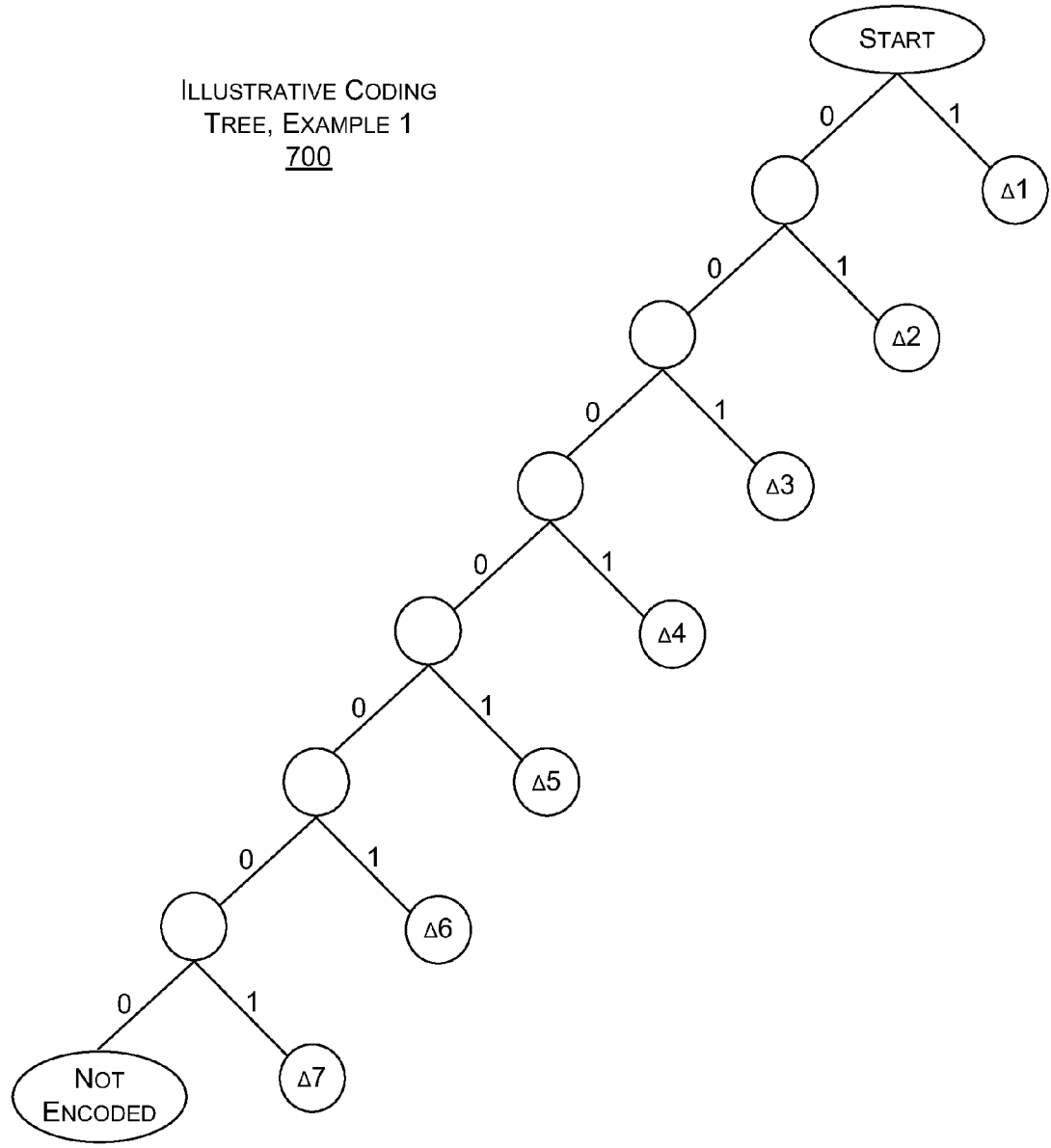
FIGS. 7 and 8 show two different coding trees that can be used to compress data values using the compression functionality of FIG. 5.

The delta encoding module 516 can include a table which maps the delta values to appropriate code words. FIG. 7 shows one coding tree 700 that can be used to populate such a table. The decompression module 112 can use the same coding tree 700 to subsequently decode the compressed m/z data values.

More specifically, the coding tree 700 can be used to translate delta values of $\Delta 1, \Delta 2, \ldots, \Delta 7$ into respective code words. The coding tree 700 associates these delta values with respective nodes in the coding tree 700. Further, the coding tree 700 assigns binary values (1 or 0) to the edges that connect the nodes together. The code word associated with a particular delta value can be derived by tracing a path through the tree that leads to the node assigned to the delta value. The edges traversed by this path define the code word. For example, consider the path which connects a root node ("Start") to the delta value corresponding to $\Delta 5$. That path traverses edges having bit values 0, 0, 0, 0, and 1. Therefore, the delta encoding module 516 can assign the code word 00001 to the delta value $\Delta 5$. By contrast, the delta encoding module 516 can assign a single bit 1 to the delta value $\Delta 1$, and a two-bit code word 01 to the delta value $\Delta 2$, and so on.

Note that a terminal node in the coding tree 700 indicates that a corresponding delta value is not encoded, e.g., because it is not a common delta value and is therefore not worth encoding. The delta encoding module 516 can represent such a delta value in full (non-compressed) form.

Figure 8:
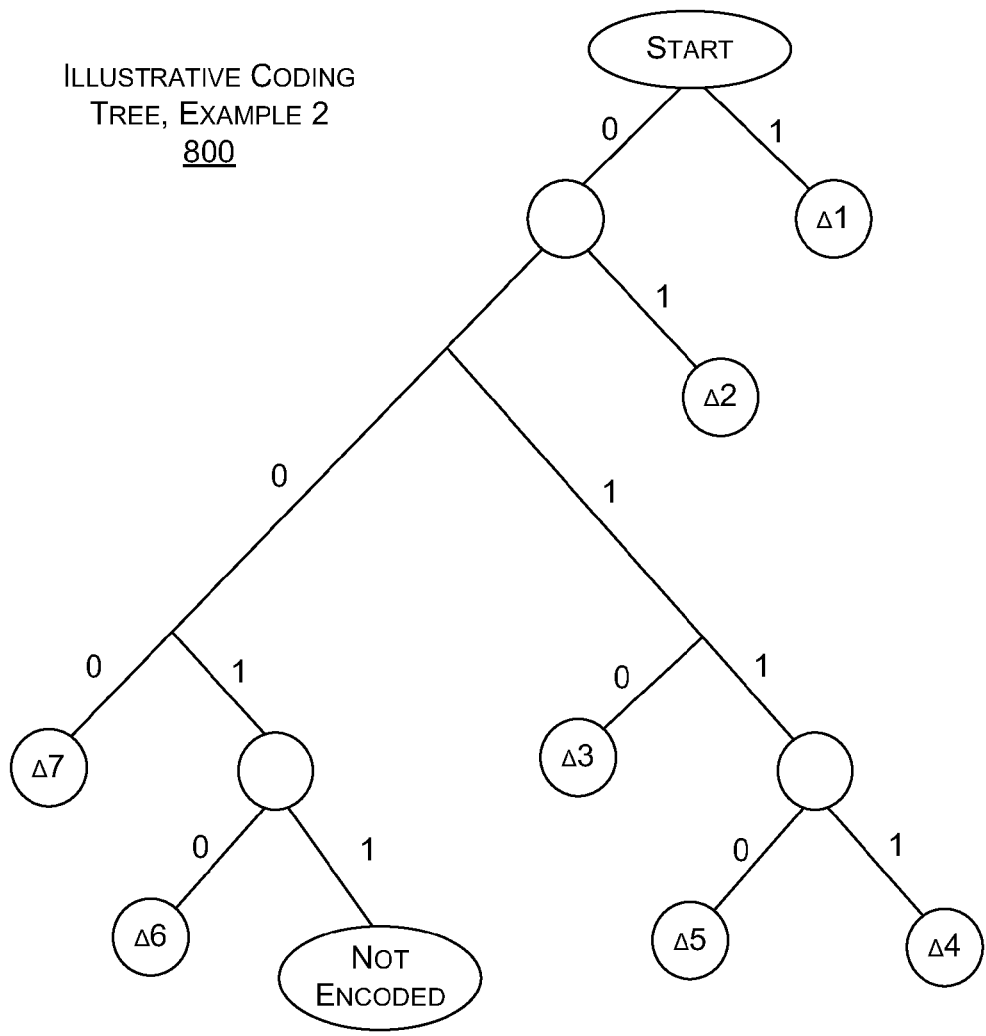

FIG. 8 shows another coding tree 800 for mapping delta values into code words. In this case, the coding tree 800 adopts a more distributed approach compared to the coding tree 700 of FIG. 7, e.g., by including more lateral branching compared to the coding tree 700 of FIG. 7. This yields a more even distribution of code word lengths compared to the coding tree 700 of FIG. 7. For example, the coding tree 800 of FIG. 8 assigns a code word of 0110 to the delta value $\Delta 5$ and a code word of 0010 to the delta value $\Delta 6$, whereas the coding tree 700 of FIG. 7 assigns code words of different lengths to these delta values.

Different coding trees provide more efficient compression results for different data sets, depending on the distribution of delta values in the data sets. For example, the coding tree 700 shown in FIG. 7 is highly effective for data sets that contain a high prevalence of small delta values, and, in particular, for data sets in which the prevalence of delta value $\Delta 1$ is greater than the prevalence of delta value $\Delta 2$, and the prevalence of delta value $\Delta 2$ is greater than the prevalence of delta value $\Delta 3$, and so on. The coding tree 800 of FIG. 8 is also effective for data sets that contain a high prevalence of small data values. But in that case, the prevalence of some delta values is similar to the prevalence of other delta values, e.g., where the prevalence of delta value $\Delta 5$ is similar to the prevalence of delta value $\Delta 6$, and so on.

To provide an effective encoding algorithm for a set of delta values, the algorithm selection module 518 can determine the distribution of delta values within the set of delta values. The algorithm selection module 518 can then select an encoding algorithm which provides an efficient compression for that distribution, e.g., by selecting the coding tree which results in the greatest amount of compression (in comparison to other candidate coding trees which have other respective compression performances).

In other cases, the algorithm selection module 518 can select other types of encoding algorithms besides coding trees, such as a Shannon-Fano encoding algorithm, a Huffman encoding algorithm, and so on. The use of coding trees is presented by way of representative example, not limitation.

Figure 9:
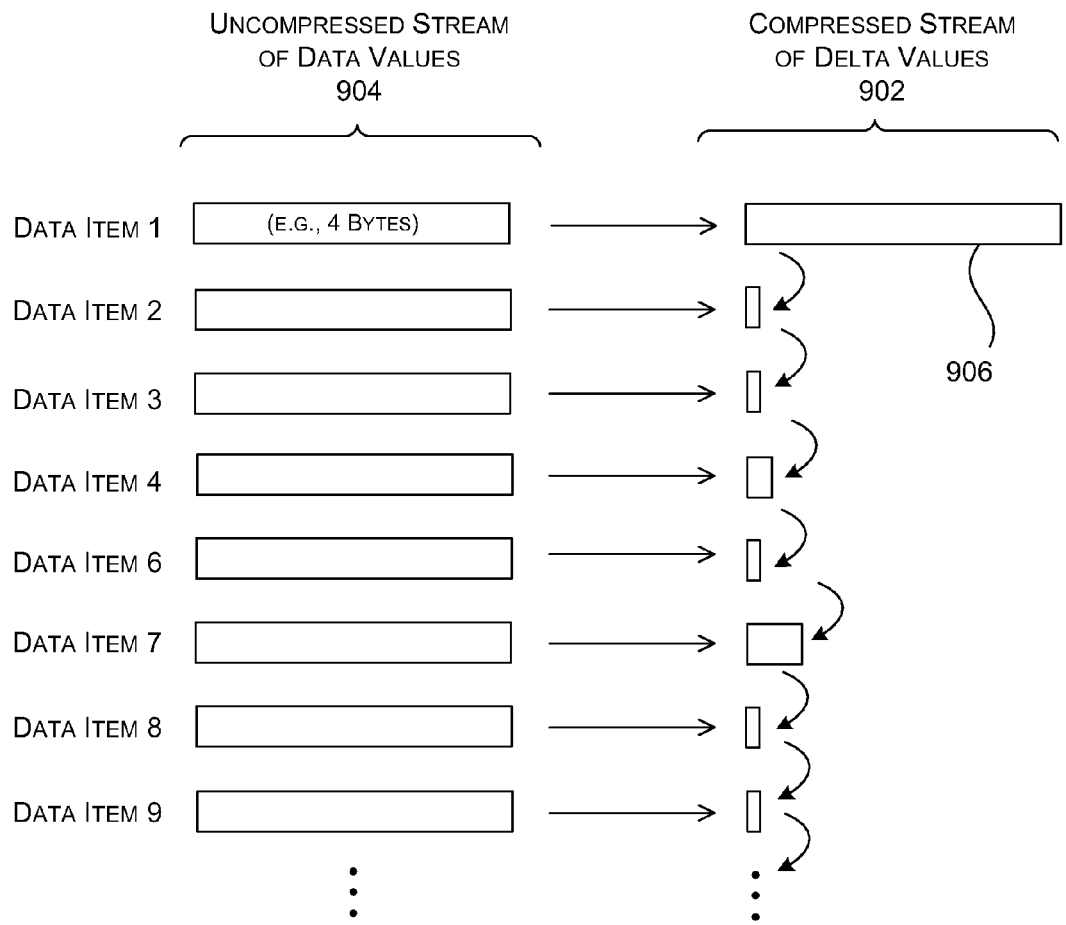
FIG. 9 shows a high-level representation of a stream of compressed data produced by the compression functionality of FIG. 5, in comparison to a stream of uncompressed data.

The delta encoding module 516 outputs a stream of encoded delta values. FIG. 9 provides a graphical illustration of such a compressed stream 902 of delta values. As a first point, note that the compressed stream 902 of delta values includes a prevalence of short code words (represented by the length of the bars associated with respective data items). These short code words correlate to small delta values. For this reason, the coding module 508 can represent the compressed stream 902 of delta values in much fewer bits compared to an uncompressed stream 904 of original index values. For example, assume for the sake of concrete comparison, that the uncompressed stream 904 represents each index value as a four-byte value. In this case, the uncompressed stream 904 represents each of its index values with 32 bits, whereas the compressed stream 902 can represent many of its delta values with just one, two, or three bits, etc.

As a second point, note that, in addition to the encoded delta values, the delta encoding module 516 also generates an initial data value 906 which represents the actual index value of a corresponding m/z data value (e.g., also referred to as an absolute or non-relative data value). For example, the initial data value 906 might have the index value 121 (corresponding to the example of FIG. 6), which points to a corresponding location in the master table 510 (which, in turn, provides an actual m/z value). Any subsequent delta value is interpretable with reference to a chain of values which starts with the initial data value 906 and terminates in the target subsequent delta value. For example, assume that the task at a particular instance of time is to reconstruct the actual index value associated with data item 7. This index value can be reconstructed by starting with the initial data value 906, and then recursively adding each subsequent delta value to this initial data value 906, until the delta value for the data item 7 is reached. In other words, the index value for this data item can be reconstructed in incremental fashion by moving down the chain, adding a delta value at each step.

Based on this manner of reconstructing index values, the initial data value 906 may be considered as an access point at which subsequent index values can be reconstructed. In one implementation, the coding module 508 can represent the initial data value in expanded form, e.g., in one representative and non-limiting case, as a four-byte data value, or a data value of even greater precision. The coding module 508 can afford to represent the initial value in expanded non-relative form because the stream otherwise has a large number of short code words corresponding to prevalent small delta values.

As will be clarified next, the algorithm selection module 518 can define plural access points for any stream of delta values. This facilitates quick random access into the stream of delta values.

Figure 10:
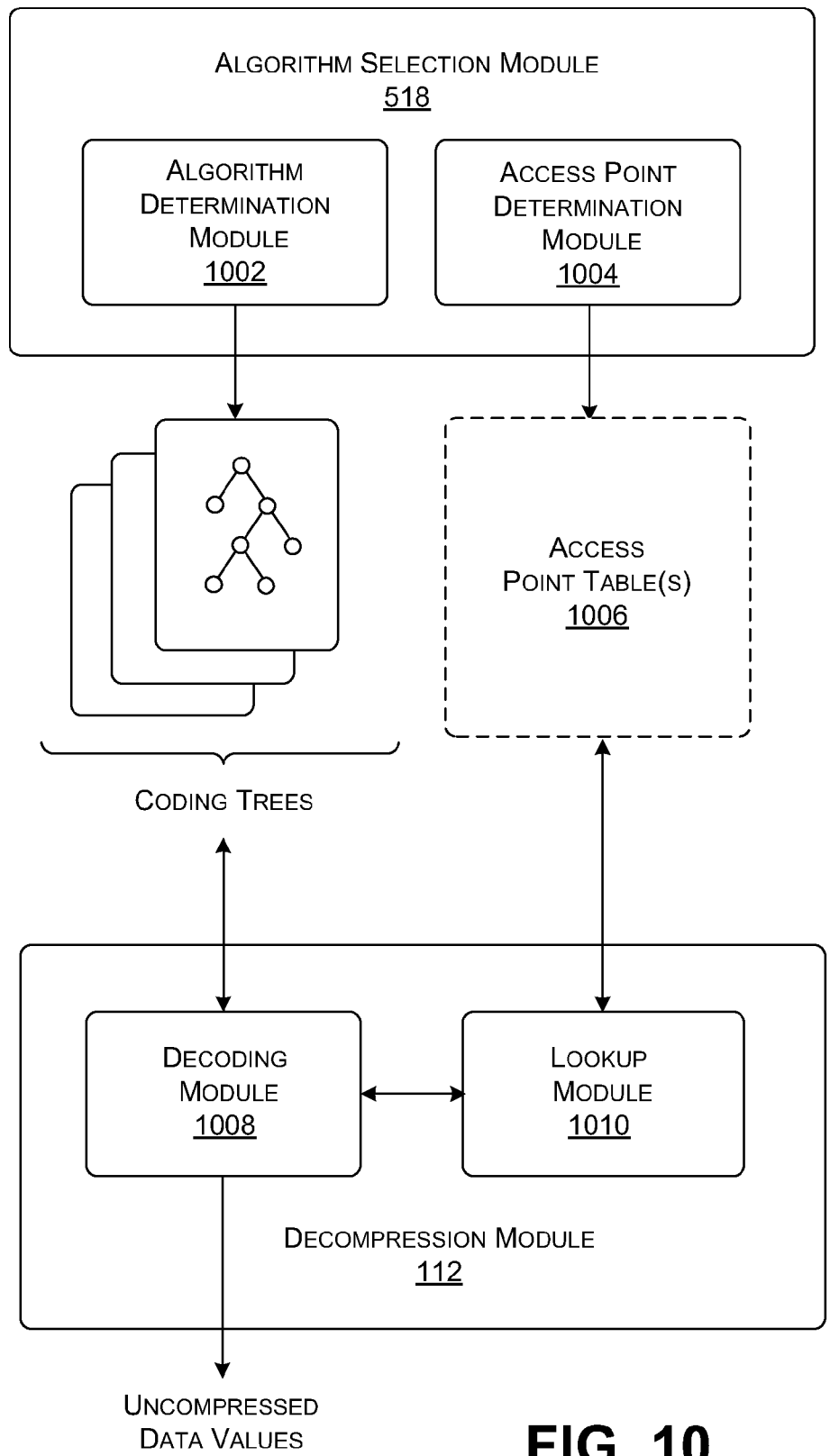
FIG. 10 describes an illustrative algorithm selection module for selecting encoding algorithms (e.g., coding trees, dictionaries, etc.) and access points.

Advancing to FIG. 10, this figure provides a more detailed depiction of the algorithm selection module 518, which complements the topics introduced above. The algorithm selection module 518 includes an algorithm determination module 1002 which performs the core functions described above, namely, selecting an encoding algorithm with a satisfactory (e.g., a highest) compression ratio to compress a set of delta values.

More specifically, consider that the delta formation module 514 provides a stream of delta values for each retention time (RT) data value. Further consider that each separate stream of delta values is composed of sub-streams of delta values that may exhibit different respective distributions of delta values. This means that different encoding algorithms may be appropriate to compress different parts of the streams. To address this phenomenon, the algorithm determination module 1002 performs analysis on each stream of delta values to dynamically identify sub-streams in which the delta values have common distribution-related characteristics. The algorithm determination module 1002 then dynamically selects an encoding algorithm that is deemed suitable for each sub-stream (and for each corresponding subset of delta values). The algorithm determination module 1002 can apply any of the considerations described above (e.g., with reference to the examples of FIGS. 7 and 8) to make this determination.

An access point determination module 1004 works in cooperation with the algorithm determination module 1002 to define, for each identified sub-stream of data values, one or more access points. As noted above, an access point corresponds to an initial data value that is represented as an actual (non-relative) index value, rather than as a delta value. Within a sub-stream, delta values which follow the initial data value can be represented with ultimate reference to the initial data value. The examples which follow will clarify these concepts.

The access point determination module 1004 generates indexing information regarding the locations of the access points in the streams of delta values. The access point determination module 1004 then stores this indexing information in one or more access point tables 1006.

Note that the use of the access points increases the speed at which data values can be accessed. But there is also some processing overhead associated with the use of access points (and associated sub-streams), which may negatively affect processing speed. In view of this, based on a particular environment-specific configuration setting, the access point determination module 1004 can select a number of access points for a particular stream which provides a desired random access performance together with a desired level of compression. Such a selection may represent a tradeoff, particularly as the number of access points is increased.

The algorithm selection module 518 can also store information pertaining to the encoding algorithms (e.g., coding trees) that were used to encode the streams of delta values (or other types of values). For example, in one case, information regarding the encoding algorithms that were used can be provided in a header of the compressed mass spectrometry data. Alternatively, or in addition, information regarding the encoding algorithms can be integrated into the data streams. Alternatively, or in addition, information regarding the encoding algorithms can be provided in a separate file, and so on. Further, the compressed mass spectrometry data can provide any mechanism for referencing the encoding algorithms. For example, in one implementation, each sub-stream can include linking information which points to the algorithm that was used to encode the sub-stream, and hence the algorithm that can be used to decode the sub-stream. In another case, information regarding the algorithm that can be used to decode a sub-stream is provided in a header of the sub-stream itself, and so on.

Now advancing to a description of the decoding phase of processing, FIG. 10 also provides a high-level depiction of the decompression module 112, introduced with respect to FIG. 1. The decompression module 112 includes a decoding module 1008 for decoding the compressed delta values with reference to the same coding trees that were used to encode the delta values (or, more generally, with reference to the same coding algorithms that were used to encode the delta values).

The decompression module 112 also includes a lookup module 1010. The lookup module 1010 receives a lookup request that defines a request to read certain parts of the mass spectrometry data. Based on that request, the lookup module 1010 can consult the access point table(s) 1006 to determine an appropriate location (or locations) at which to start decoding the compressed mass spectrometry data.

Before advancing to further examples, note that the coding module 508 has been explained above in the context of the compression of m/z data values. The coding module 508 can use the same technique to compress intensity values, e.g., by forming a master table of intensity values, forming a stream of intensity index values, forming a stream of intensity delta values, and then encoding the steam of intensity delta values with reference to one or more encoding algorithms (e.g., coding trees). Hence, the coding module 508 can output a stream of compressed m/z delta values and a stream of compressed intensity delta values.

However, in an alternative case, the coding module 508 can compress the intensity data values using a different technique compared to the m/z data values. For example, the coding module 508 can directly encode the intensity index values without first forming intensity delta values. This approach is viable because the intensity data value contains a large quantity of low-level noise, and therefore may contain a prevalence of low-level index values, e.g., 1, 2, 3, etc. The coding module 508 can leverage this observation in the same manner described above, e.g., by assigning short code words to the small intensity index values.

Figure 11:
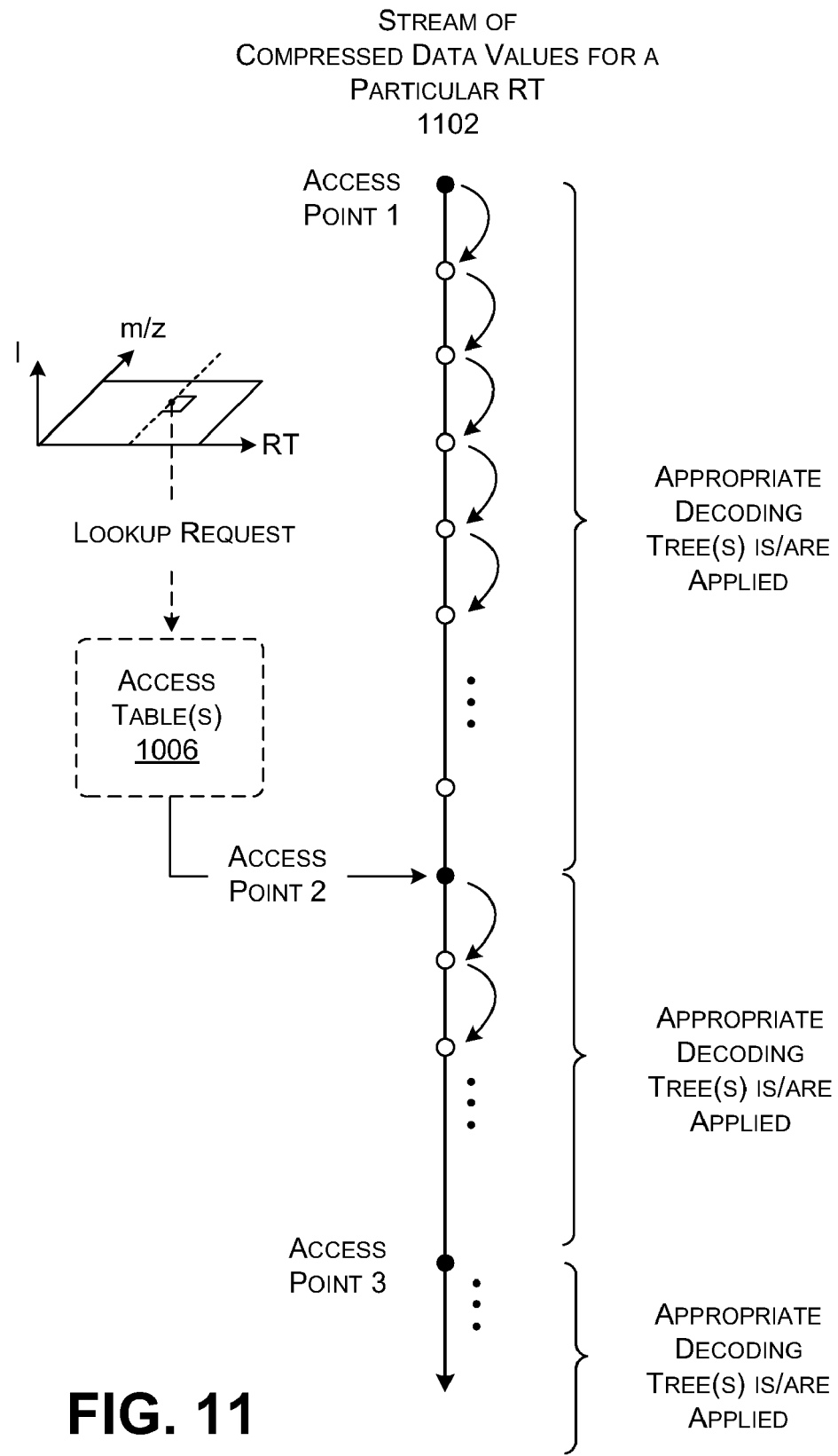
FIG. 11 shows a technique whereby a lookup request is mapped to at least one access point within a stream of compressed spectrometry data.

Now advancing to FIG. 11, this figure shows an example of an illustrative technique to decode values in a stream 1102 of values. Initially, the stream 1102 of values is described in a content-agnostic manner. As will be described below with reference to later examples, this stream 1102 can correspond to a stream of compressed m/z delta values, a stream of intensity delta values, or an interleaved combination thereof.

As shown, the stream 1102 of values corresponds to values captured at a particular retention time. The stream 1102 of values is also divided into multiple sub-streams of data values. Each sub-stream of data values commences with an initial data value, which represents an index value in non-relative form, rather than as a delta value. Subsequent delta values in a sub-stream are interpretable with ultimate reference to the initial data value. Each initial data value also defines an access point into the sub-stream. FIG. 11 also indicates that a separate encoding algorithm may have been applied to encode the values in each sub-stream of values. This means that the decompression module 112 will apply a complementary different decoding algorithm to decode the values in each sub-stream of values.

Assume that the user wishes to determine the m/z data values and the intensity data values within a particular region of the LC/MS spectra. The user may formulate that request by specifying a portion of the LC/MS spectra defined by a range of RT values and a range of m/z values.

Based on such a request, the lookup module 1010 (of FIG. 10) consults the access point table(s) 1006 to determine appropriate locations at which to start reading the compressed values in order to reconstruct the ultimate desired target value(s). In the simplified example of FIG. 11, assume that lookup module 1010 determines that a first point at which to start decoding the values corresponds to access point 2 in the stream 1102 associated with a particular RT data value. This is because this access point is the closest access point which precedes the target value(s) specified by the lookup request. More generally, the lookup module 1010 may map a single lookup request to multiple access points within multiple RT data streams. However, to facilitate explanation, FIG. 11 depicts a single access made within the single stream 1102.

Upon accessing the initial data value corresponding to access point 2, the decoding module 1008 commences to decode the values presented in the stream. The decoding module 1108 also successively converts each decoded delta value into an appropriate index value. In performing decoding, the decoding module 1008 applies the decoding algorithm which is appropriate for interpreting the particular sub-stream from which it is reading.

Figure 12:
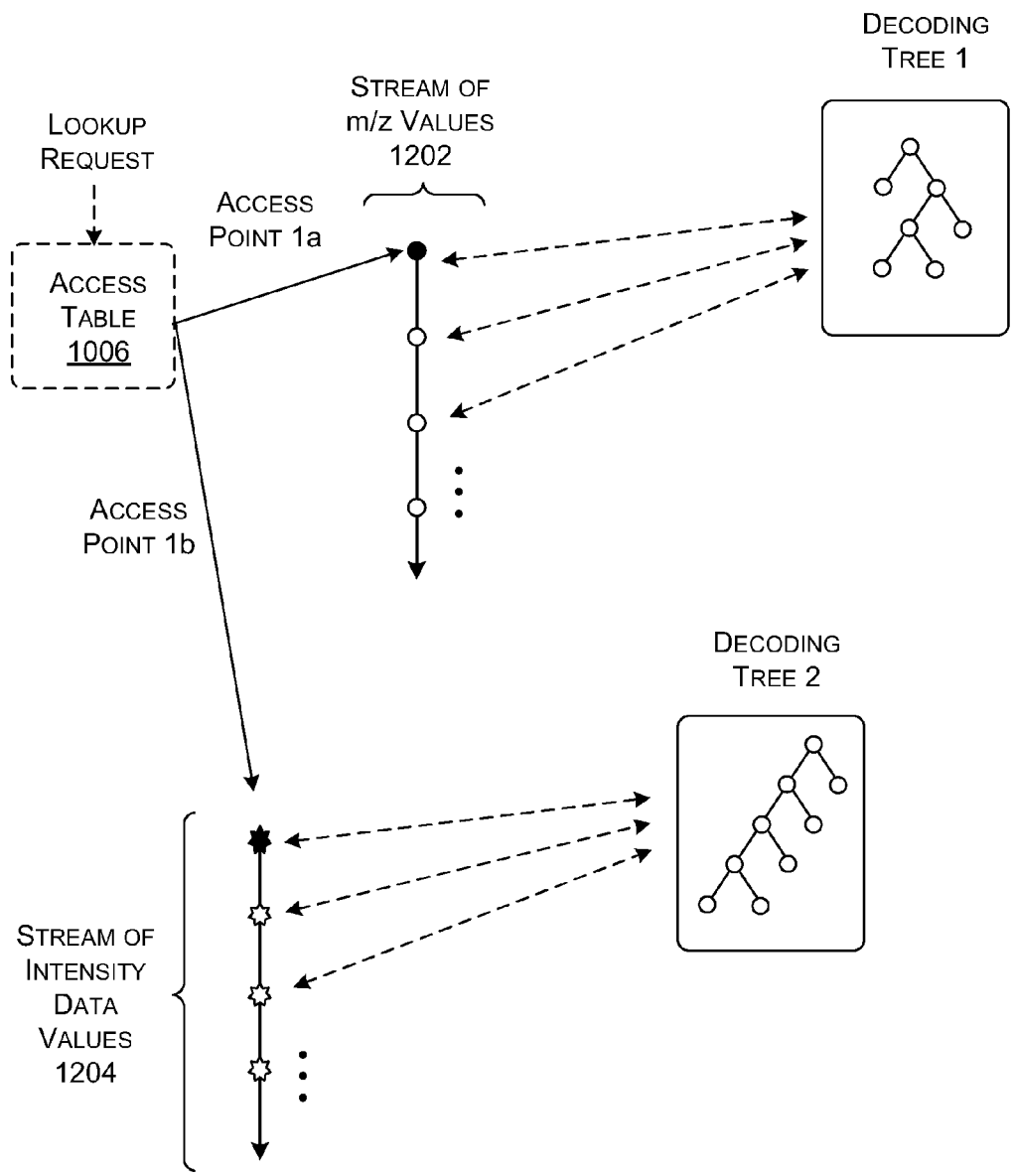
FIGS. 12 and 13 show two respective versions of the lookup technique shown in FIG. 11.

FIG. 12 illustrates a first way to implement the general concepts imparted by FIG. 11. In this case, one or more access point tables 1006 maps the lookup request to a first access point in a stream 1202 of m/z delta values, and to a second access point in a separate stream 1204 of intensity delta values. The respective access points correspond to actual index values, rather than delta values. The decoding module 1008 then commences decoding the m/z delta values in the stream 1202 using a first decoding algorithm, and decoding the intensity delta values in the stream 1204 using a second decoding algorithm.

Figure 13:
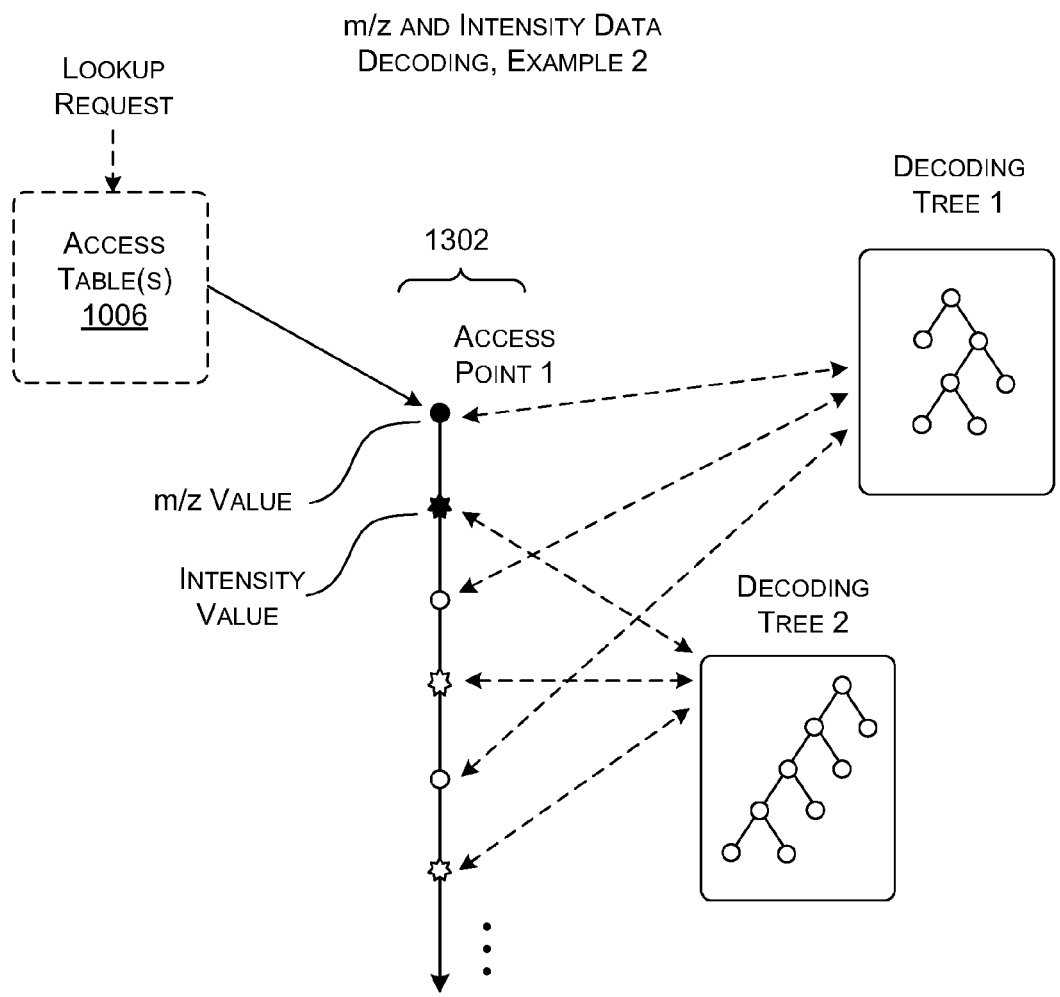

FIG. 13 illustrates a second way to implement the general concepts of FIG. 11. In this case, the access point table(s) 1006 maps the lookup request to an access point in a single stream 1302 of delta values. But that single stream 1302 of delta values interleaves m/z delta values and intensity delta values. Namely, the access point can correspond to an initial (non-relative) m/z index value. The next value in the stream can correspond to an initial (non-relative) intensity index value. The next value in the stream can correspond to an encoded m/z delta value. The next value in the stream can correspond to an encoded intensity delta value, and so on. In the manner stated above, the decoding module 1008 can use a first decoding algorithm to decode the m/z values and a second decoding algorithm to decode the intensity values. Hence, the decoding module 1008 will toggle between two decoding modules to decode the stream 1302.

B. Illustrative Processes

FIGS. 14-21 explain the operation of the compression module 106 and the decompression module 112 in flowchart form, with illustrative examples. Since the principles underlying the operation of these modules (106, 112) have already been described in detail in Section A, certain operations will be addressed in summary fashion in this section.

Figure 14:
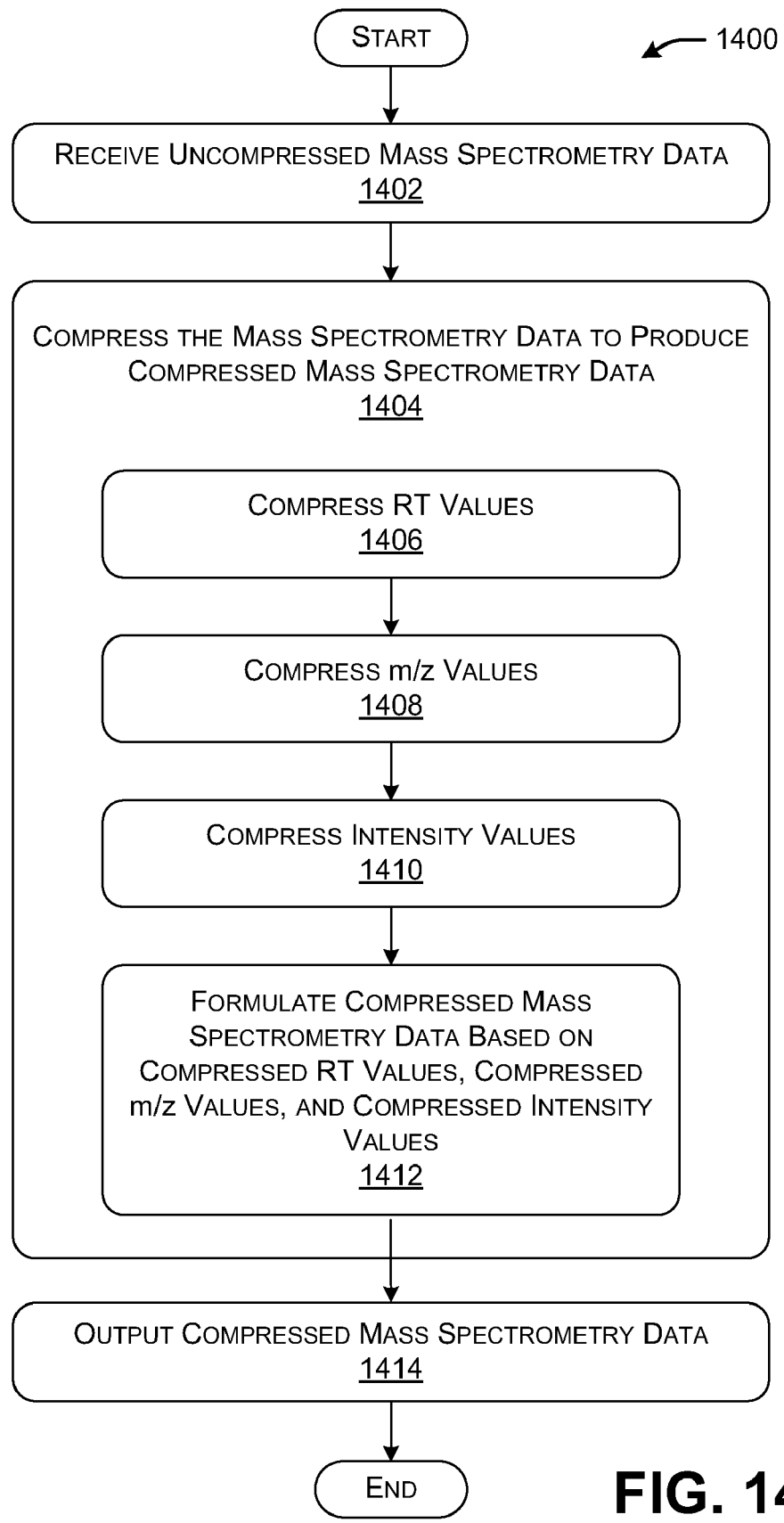
FIG. 14 is a flowchart that shows an overview of one manner of operation of the compression module of FIG. 3.

Starting with FIG. 14, this figure shows an overview of a procedure 1400 for compressing mass spectrometry data. In block 1402, the compression module 106 receives uncompressed mass spectrometry data. In block 1404, the compression module 106 compresses the mass spectrometry data to produce compressed mass spectrometry data. This operation, in turn, can include component compression operations. Namely, in block 1406, the compression module 106 can compress RT data values to provide compressed RT data values. In block 1408, the compression module 106 can compress m/z data values to provide compressed m/z data values. In block 1410, the compression module 106 can compress intensity data values to provide compressed intensity data values. In block 1412, the compression module 106 can assemble the compressed RT data values, compressed m/z data values, and compressed intensity data values into the compressed mass spectrometry data. As set forth in Section A, FIGS. 12 and 13 describe, for instance, two ways of combining the compressed m/z data values and the compressed intensity data values. In block 1414, the compression module 106 outputs the compressed mass spectrometry data, e.g., to the data store 110 or to any other target destination.

Figure 5:
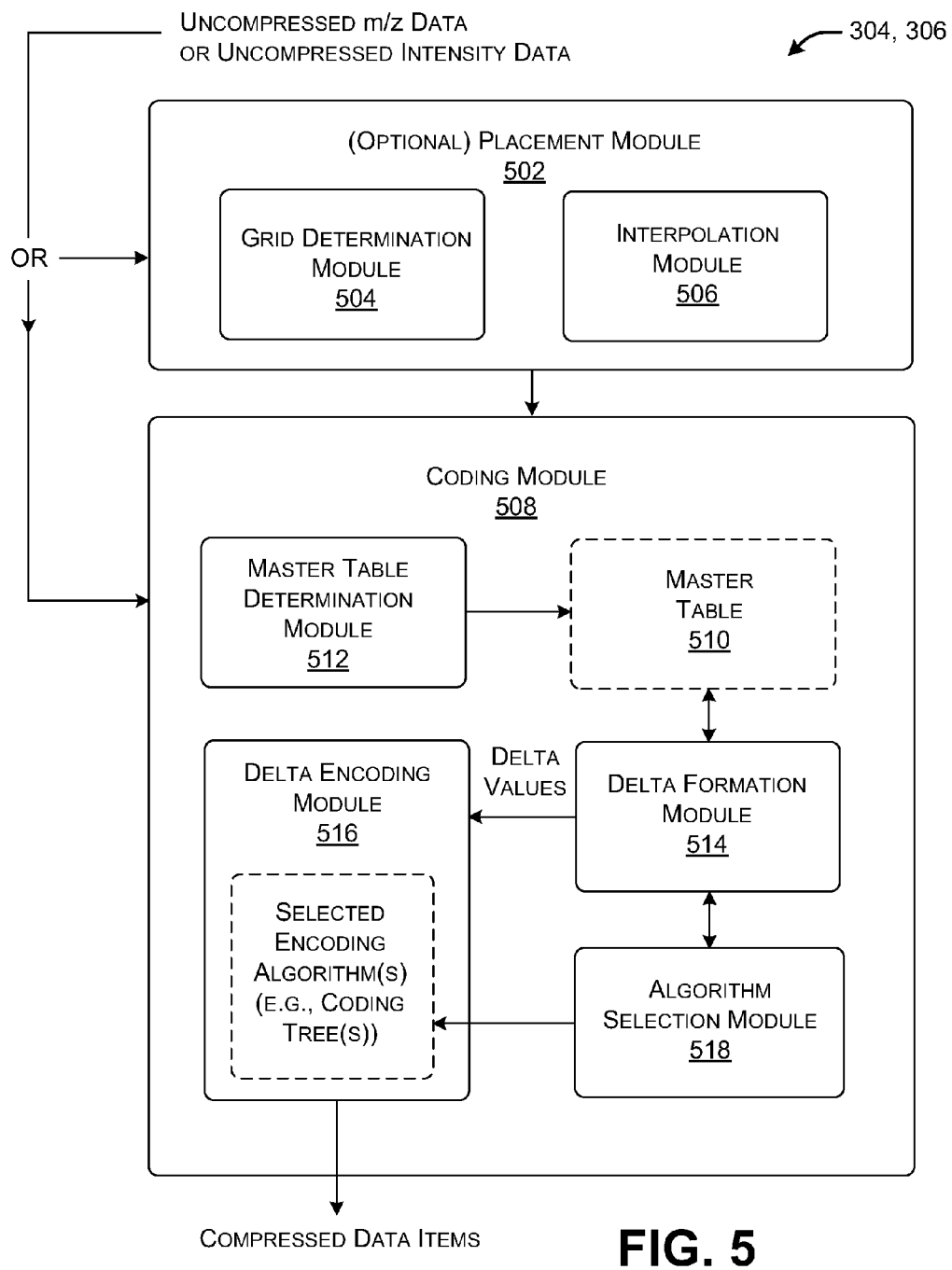
FIG. 5 shows an example of compression functionality for compressing data values using the compression module of FIG. 3. In one example, the compression functionality represents an m/z compression module. In another example, the compression functionality represents an intensity compression module.
Figure 6:
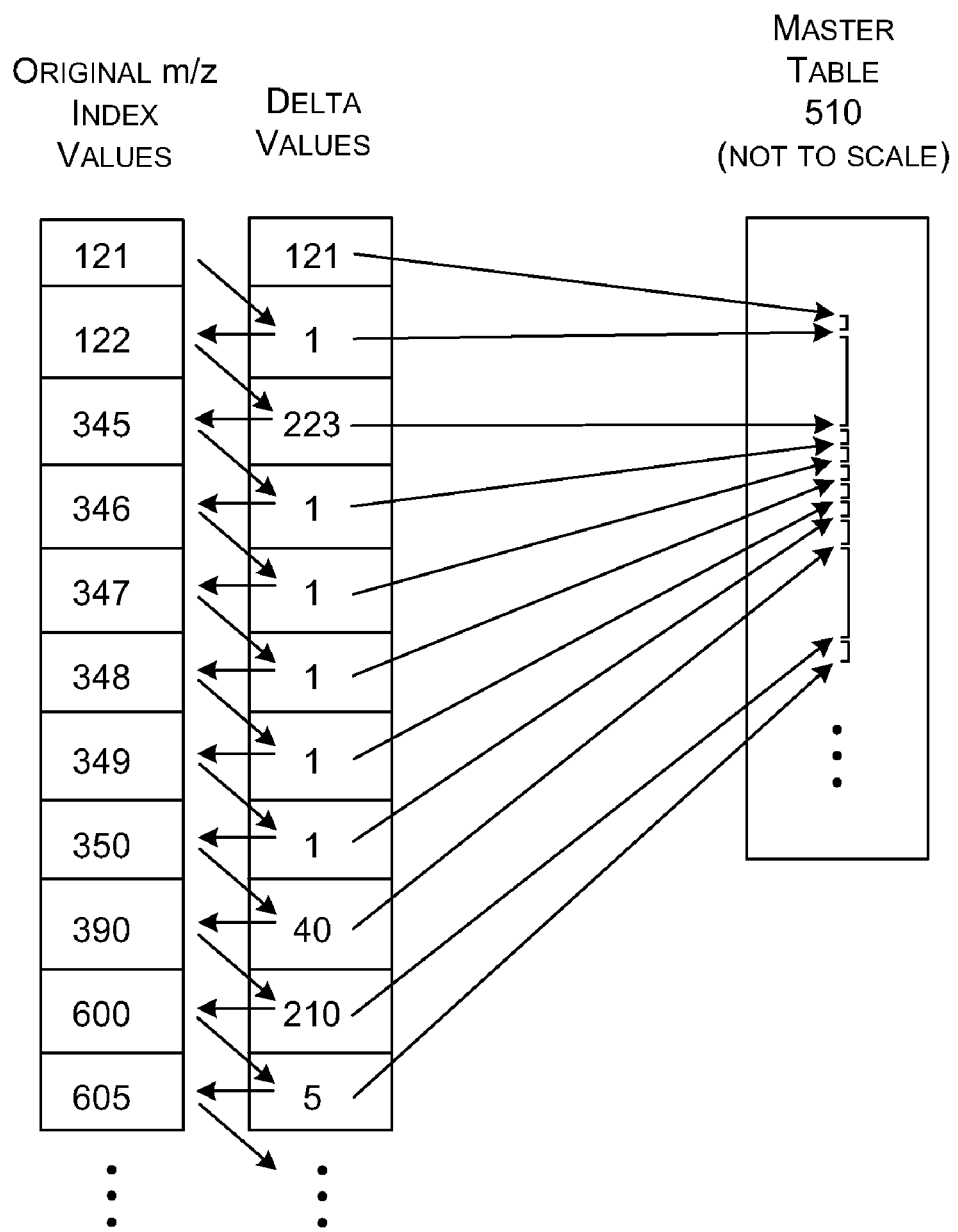
FIG. 6 shows an example of a technique for mapping data values into delta values.
Figure 15:
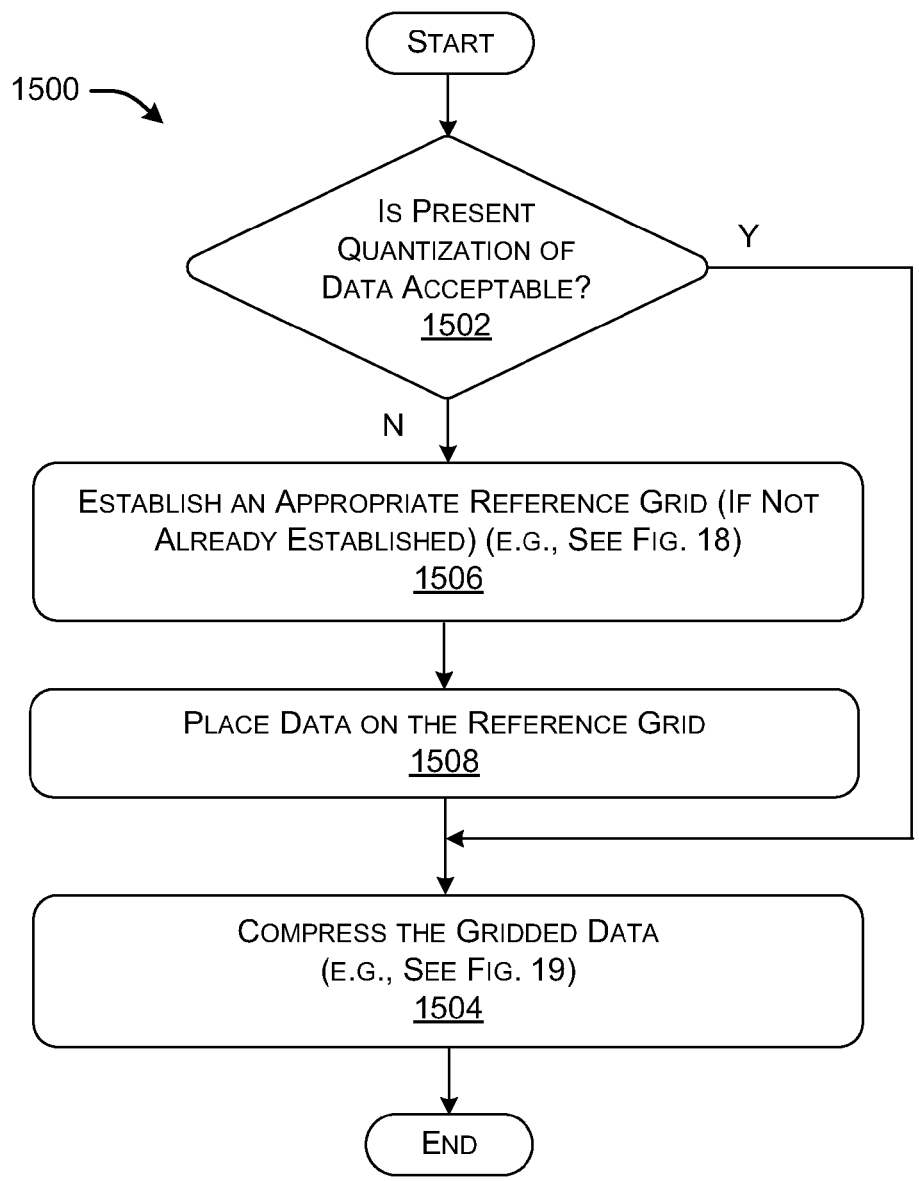
FIG. 15 is a flowchart that shows an overview of one manner of operation of a placement module of FIG. 5.

FIG. 15 sets forth a procedure 1500 that explains one manner of operation of the placement module 502 of FIG. 5. The placement module 502 can be described in the context of processing performed on m/z data values or intensity data values. To simplify explanation, FIG. 15 will be explained below in the context of processing performed on intensity data values; but the explanation also applies to processing performed on m/z data values.

In block 1502, the placement module 502 determines whether the intensity data values are already represented in a manner that accommodates subsequent compression to be performed on the intensity data values. For example, the mass spectrometry measurement mechanism 102 may already have quantized the intensity data values onto a suitable reference grid. As set forth above, a reference grid defines a means by which a continuous range of values is translated into discrete values. If block 1502 is answered in the affirmative (meaning that the current quantization of the intensity data values is sufficient), then the intensity compression module 306 proceeds to compress the gridded intensity data, as per block 1504.

On the other hand, in block 1506, if the quantization is not deemed acceptable (either because it has not yet been performed or it has not been performed in a suitable manner), the placement module 502 first establishes an appropriate reference grid on which to place the intensity data values. Then, in block 1508, the placement module 502 places the intensity data values onto the reference grid, e.g., by performing nearest-neighbor interpolation or any other placement technique.

Figure 18:
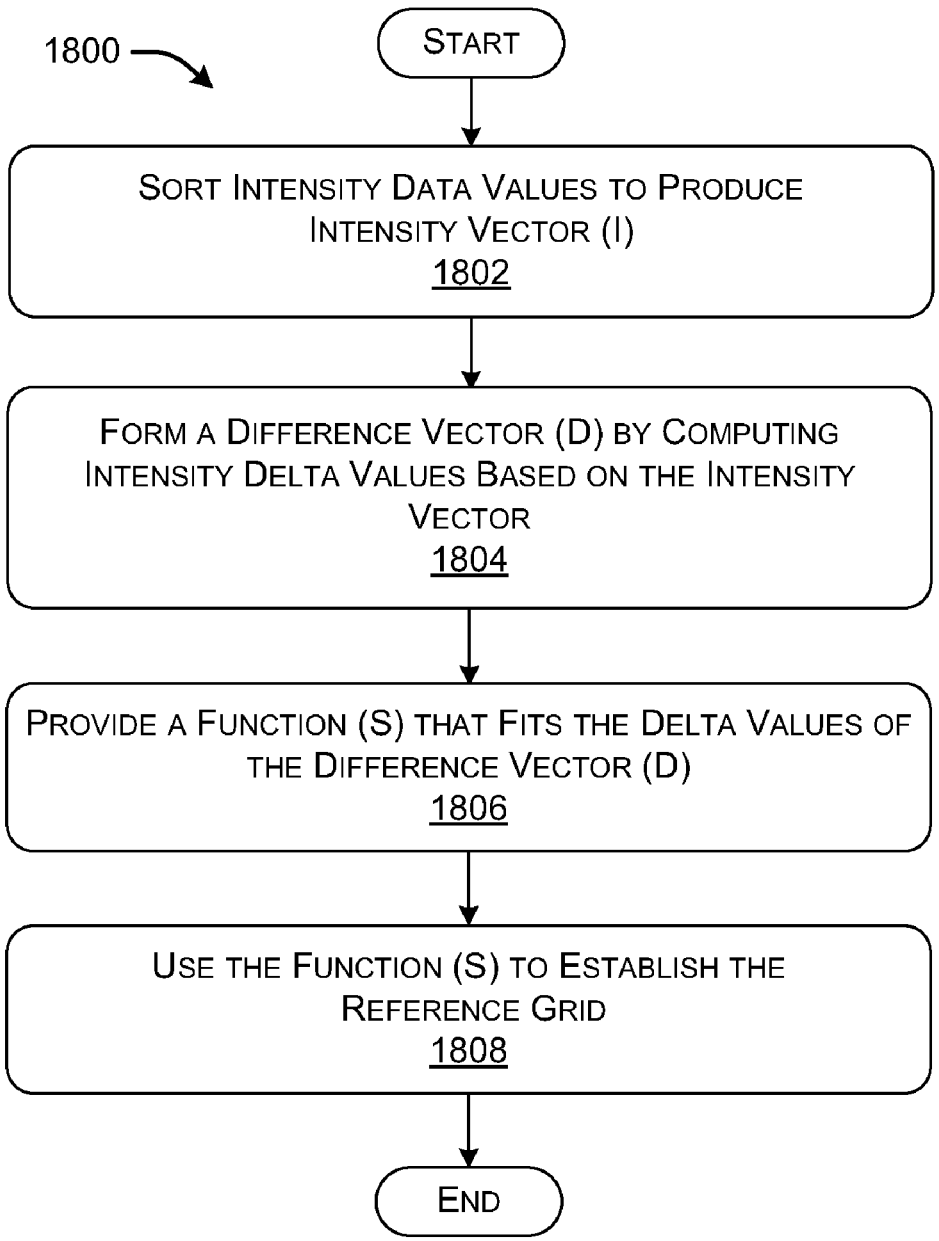
FIG. 18 is flowchart, in conjunction with the graph of FIG. 17, that represents one way of establishing a reference grid on which to place intensity data values.

FIG. 18 describes a procedure 1800 that represents one way to perform block 1506 of FIG. 15. In this procedure, the placement module 502 defines a reference grid on which to place the intensity data values.

Figure 16:
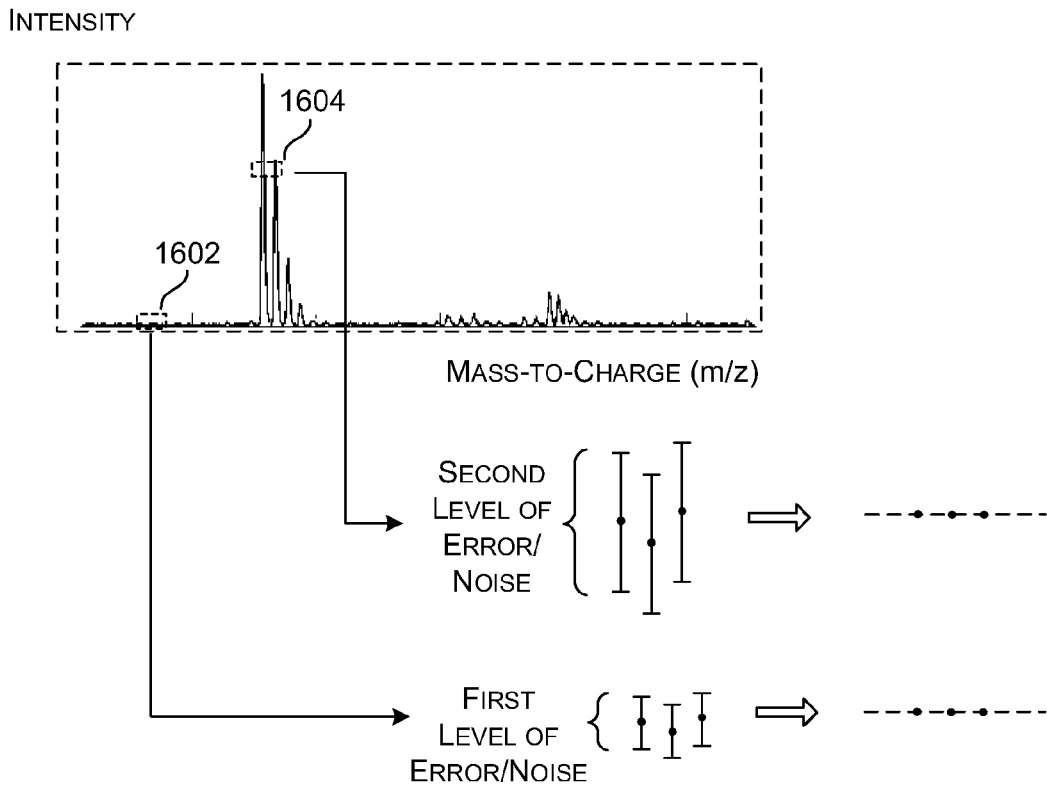
FIG. 16 is a plot of mass spectrometry data which highlights the effects of noise at different intensity levels.
Figure 17:
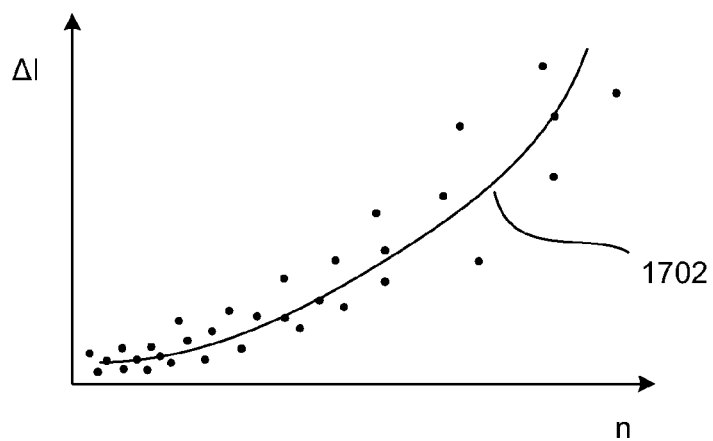
FIG. 17 is a graph that conveys a distribution of intensity delta values.

Before advancing to that procedure 1800, consider FIGS. 16 and 17, which describe the characteristics of the intensity data values in one environment. As shown in FIG. 16, the intensity data values exhibit a few dramatic spikes over a general background of low-level noise. Further, FIG. 16 graphically illustrates that the level of noise may differ at different levels of intensity. For example, the intensity values in region 1602 have low levels. The degree of error in this region 1602 has a first general range. The intensity data values in region 1604 have high levels. The degree of error in this region 1604 has a second general range. As shown, the absolute range of error may increase as the intensity level grows larger. That is, the absolute range of error for region 1604 is greater than the absolute range of error for region 1602.

Nevertheless, the impact of the error at different intensity data values is different. For example, although the region 1602 may have a lower absolute range of error, the non-noise component of the intensity data values in that region is effectively obscured by the noise. In contrast, the region 1604 has a higher absolute range of error. But the relative impact of this error is small, such that it does not obscure the non-noise component of the intensity data values in wholesale fashion.

FIG. 17 represents a distribution of intensity delta values as a function of intensity level. The intensity delta values correspond to local perturbations that may, in turn, reflect noise at different intensity levels, among other factors. The manner in which this distribution is computed is set forth below. From a high-level perspective, this distribution reflects the concepts identified above. Namely, FIG. 17 indicates that the rate of change in the intensity values (represented by the intensity delta values) varies over the range of intensity levels.

Based on the above observations, the placement module 502 can select a reference grid that dynamically encompasses the full range of intensity data values that have been measured, e.g., from smallest to largest. Further, the placement module 502 can dynamically select the gradations of the reference grid which are appropriate in view of the intensity variations that are present at different levels of intensity. At any intensity level, the placement module 502 will seek to avoid defining gradations (bins) that cannot meaningfully compete with noise. Generally, this means that the placement module 502 may select increasingly larger gradations with increasing intensity level.

FIG. 18 describes a procedure 1800 which provides one technique for carrying out the above-described analysis. In block 1802, the placement module 502 sorts the intensity data values to produce an intensity data vector (I). In block 1804, the placement module 502 forms a difference vector that includes intensity delta values; the intensity data values are formed from the intensity data vector, e.g., by computing differences between pairs of neighboring intensity data values in that vector. In block 1806, the placement module 802 fits a function S (such as a spline function) to the delta values in the difference vector. FIG. 17 illustrates one such function 1702 that has been fit onto the delta values. In block 1808, the placement module uses the function S to establish the reference grid on which to place intensity values.

For example, assume that a first (minimum) intensity value of the reference grid is selected to have value $I_0$. The second intensity data value ($I_1$) is found by identifying the general variation of intensity values in the region of intensity value Assume that the extent of such variation is $S_0$, which can be obtained based on the function S, e.g., $S_0 = S(I_0)$. The second intensity data value $I_1$ is then formed by multiplying $S_0$ by a compression factor k, e.g., $I_1 = k*S_0$. Subsequent intensity data values ($I_3, I_4, \ldots$) are formed in a similar manner, up to a maximum intensity data value. The compression factor k can be selected to govern the number of gradations (bins) that are produced.

To repeat, the above described placement techniques have been described with reference to intensity data values. But a similar procedure can be performed with respect to m/z data values.

Figure 19:
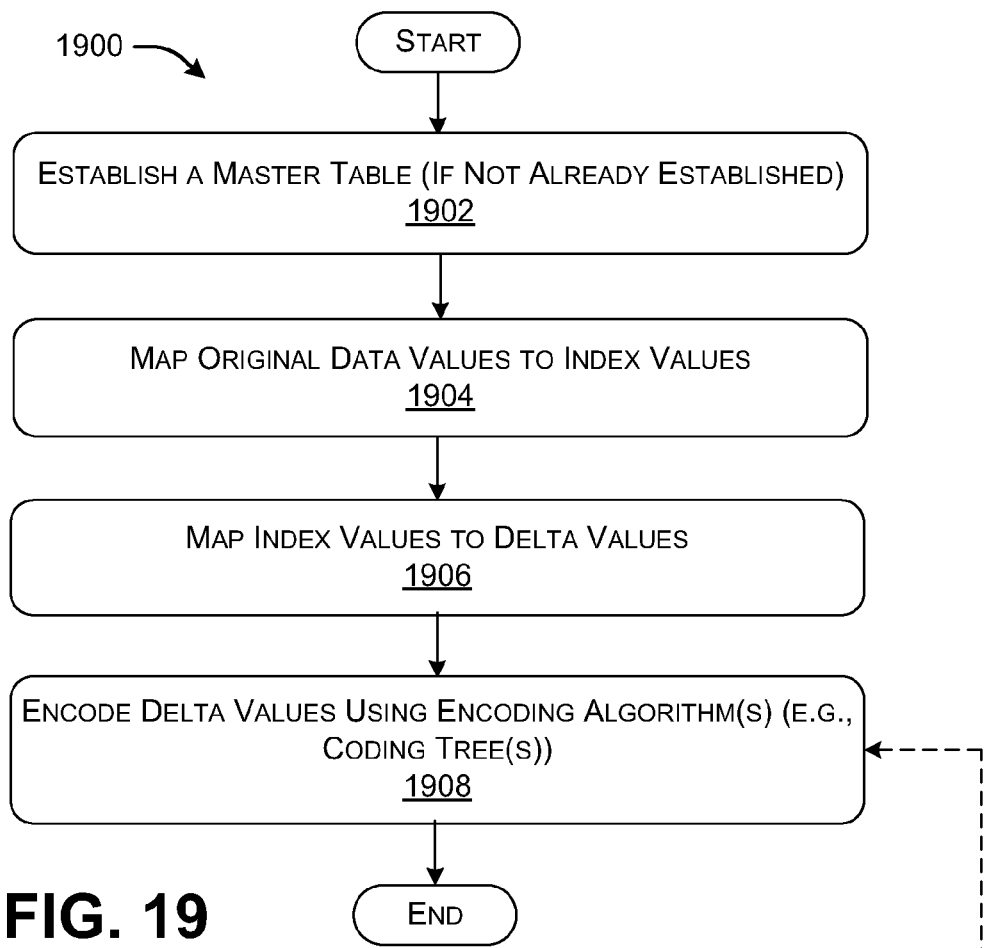
FIG. 19 is a flowchart that sets forth one way of forming and compressing delta values, e.g., either m/z delta values or intensity delta values.

FIG. 19 describes a procedure 1900 for compressing any data values, such as m/z data values or intensity data values. In block 1902, the coding module 508 forms a master table of data values (if this table has not already been formed). In block 1904, the coding module 508 maps the original data values into index values. In block 1906, the coding module 508 maps the index values into delta values. In block 1908, the coding module 508 encodes the delta values using one or more encoding algorithms (e.g., one or more coding tree).

Figure 20:
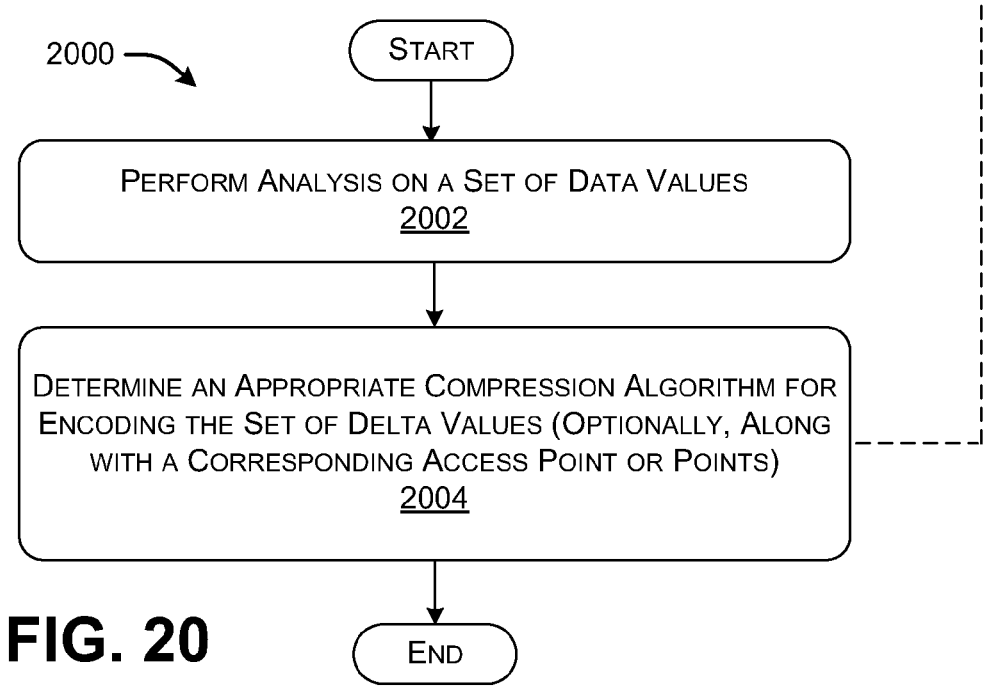
FIG. 20 is a flowchart that sets forth one way of selecting an appropriate encoding algorithm to encode a set of data values.

FIG. 20 describes a procedure 2000 for selecting the encoding algorithm(s) for use in the procedure 1900 of FIG. 19. In block 2002, the coding module 508 performs analysis on a set of delta values to determine the distribution of the delta values. In block 2004, the coding module 508 determines one or more appropriate encoding algorithms that may be used to efficiently compress the set of delta values. In addition, the coding module 508 can select the access point(s) that can be used to commence reconstruction of the compressed delta values.

Figure 21:
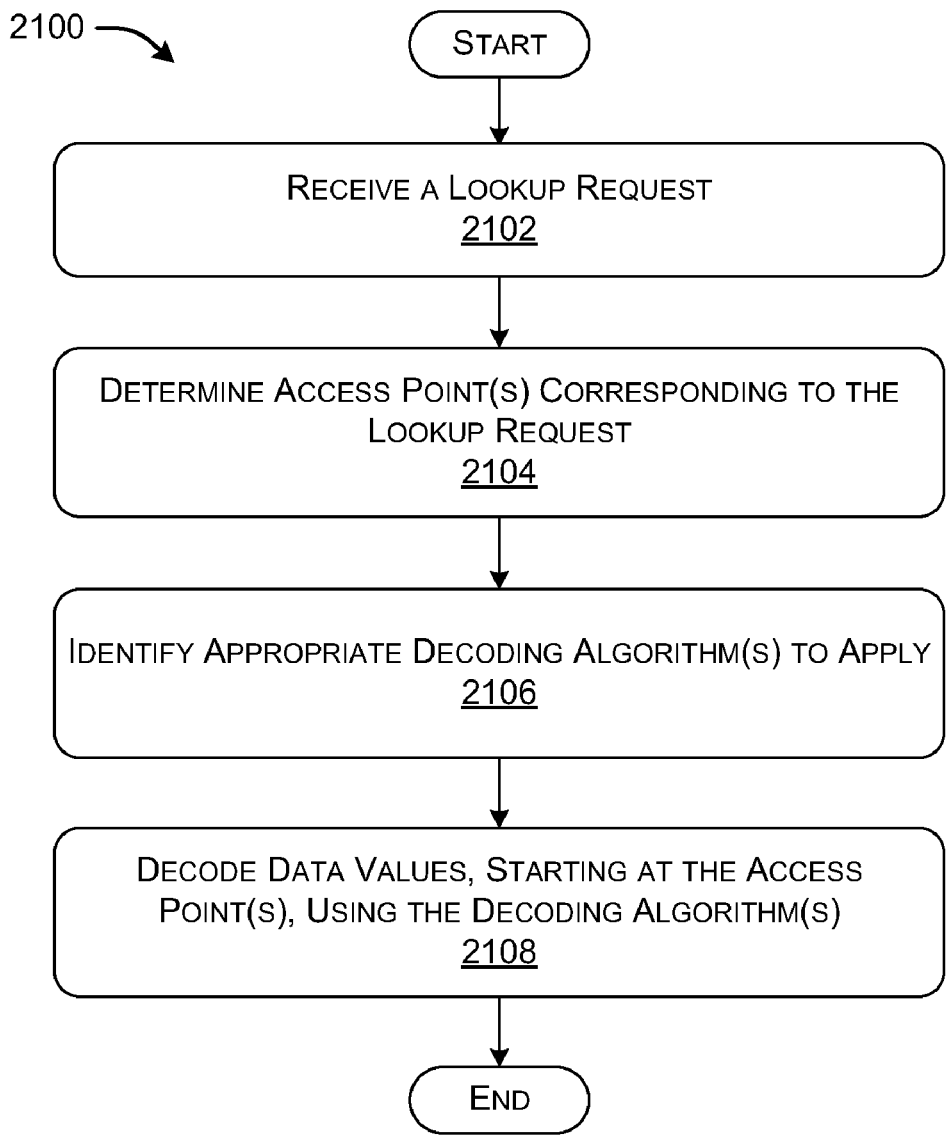
FIG. 21 is a flowchart that sets forth one manner of operation of a decompression module shown in FIGS. 1 and 10.

Finally, FIG. 21 describes a procedure 2100 for decoding compressed spectrometry data. The procedure 2100 is described in the generic context of decoding data values. The procedure 2100 can be applied to decode either m/z data values, intensity data values, or both.

In block 2102, the decompression module 112 receives a lookup request. As described in Section A, a user (or other agent) can formulate a lookup request by describing a portion of space defined by the RT and m/z axes. In block 2104, the decompression module 112 determines one or more access points at which to begin decoding the data values. In block 2106, the decompression module 2106 identifies one or more decoding algorithms to be used to decode the data values, starting at the access point(s). In block 2108, the decompression module 112 decodes the data values using the selection decoding algorithm(s), starting at the identified access point(s).

C. Representative Processing Functionality

FIG. 22 sets forth illustrative electrical data processing functionality 1300 (also referred to herein a computing functionality) that can be used to implement any aspect of the functions described above. For example, the processing functionality 1200 can be used to implement any aspect of the compression module 106, any aspect of the decompression module 112, and so on. In one case, the processing functionality 2200 may correspond to any type of computing device that includes one or more processing devices. In all cases, the electrical data processing functionality 2200 represents one or more physical and tangible processing mechanisms.

The processing functionality 2200 can include volatile and non-volatile memory, such as RAM 2202 and ROM 2204, as well as one or more processing devices 2206 (e.g., one or more CPUs, and/or one or more GPUs, etc.). The processing functionality 2200 also optionally includes various media devices 2208, such as a hard disk module, an optical disk module, and so forth. The processing functionality 2200 can perform various operations identified above when the processing device(s) 2206 executes instructions that are maintained by memory (e.g., RAM 2202, ROM 2204, or elsewhere).

More generally, instructions and other information can be stored on any computer readable medium 2210, including, but not limited to, static memory storage devices, magnetic storage devices, optical storage devices, and so on. The term computer readable medium also encompasses plural storage devices. In all cases, the computer readable medium 2210 represents some form of physical and tangible entity.

The processing functionality 2200 also includes an input/output module 2212 for receiving various inputs (via input modules 2214), and for providing various outputs (via output modules). One particular output mechanism may include a presentation module 2216 and an associated graphical user interface (GUI) 2218. The processing functionality 2200 can also include one or more network interfaces 2220 for exchanging data with other devices via one or more communication conduits 2222. One or more communication buses 2224 communicatively couple the above-described components together.

The communication conduit(s) 2222 can be implemented in any manner, e.g., by a local area network, a wide area network (e.g., the Internet), etc., or any combination thereof. The communication conduit(s) 2222 can include any combination of hardwired links, wireless links, routers, gateway functionality, name servers, etc., governed by any protocol or combination of protocols.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A coding module, implemented by physical and tangible computing functionality, for compressing data comprising a plurality of data values, comprising:
   a delta formation module configured to:
      map the data values to index values, the index values identifying respective locations of the data values in a master table of data values; and
      map the index values to delta values, the delta values identifying differences between respective neighboring pairs of index values; and
   a delta encoding module for using an encoding algorithm to represent the delta values in compressed form, to provide compressed data.

2. The coding module of claim 1, wherein the data that is compressed comprises mass spectrometry data.

3. The coding module of claim 2, wherein the data values correspond to mass-to-charge data values within the mass spectrometry data.

4. The coding module of claim 2, wherein the data values correspond to intensity data values within the mass spectrometry data.

5. The coding module of claim 1, wherein the coding module is configured to define a stream that includes an initial data value in non-relative form, together with subsequent delta values, wherein the initial data value comprises an access point at which decoding of the subsequent delta values is commenced.

6. The coding module of claim 5, wherein the coding module is configured to define plural streams, each of which includes at least one initial data value, and wherein each initial data value corresponds to an access point at which decoding of subsequent delta values is commenced.

7. The coding module of claim 1, wherein the encoding algorithm comprises a coding tree having a plurality of nodes and edges for mapping the delta values to respective code words.

8. The coding module of claim 1, further comprising an algorithm selection module configured to select the encoding algorithm based on a determination that the encoding algorithm is a suitable candidate for compressing a set of delta values having an assessed distribution of delta values.

9. The coding module of claim 8, wherein the algorithm selection module is configured to select plural encoding algorithms for operation on plural identified sets of data values.

10. The coding module of claim 9, wherein the algorithm selection module is configured to select plural access points at which decoding of the plural sets of data values is respectively commenced.

11. The method of claim 1, wherein said formulating comprises forming a stream of the compressed mass-to-charge data values and a separate stream of the compressed intensity data values.

12. The method of claim 1, wherein said formulating comprises forming a stream that interleaves the compressed mass-to-charge data values and the compressed intensity data values.

13. The method of claim 1, further comprising establishing a grid on which to place the uncompressed intensity data values before compressing the intensity data values, wherein said establishing dynamically takes account for a rate of change of the intensity data values as a function of intensity data value level.

14. The method of claim 13, wherein said establishing comprises:
   sorting the intensity data values to produce an intensity vector;
   forming a difference vector by computing pair-wise delta values from the intensity vector;
   providing a function that fits the delta values within the difference vector; and
   using the function to establish the grid.

15. A method, implemented by physical and tangible computing functionality, for compressing mass spectrometry data, comprising:
   receiving uncompressed mass spectrometry data, the uncompressed spectrometry data comprising mass-to-charge data values and intensity data values;
   compressing the mass-to-charge data values to produce compressed mass-to-charge data values;
   compressing the intensity data values to produce compressed intensity data values; and
   formulating compressed mass spectrometry data based on the compressed mass-to-charge data values and the compressed intensity data values.

16. The method of claim 15, wherein said compressing of the mass-to-charge data values comprises:
   mapping the mass-to-charge data values into mass-to-charge index values, the mass-to-charge index values identifying respective locations of the mass-to-charge data values in a mass-to-charge master table;
   forming mass-to-charge delta values, the mass-to-charge delta values identifying differences between respective neighboring pairs of mass-to-charge index values; and
   encoding the mass-to-charge delta values in compressed form, to provide the compressed mass-to-charge data values.

17. The method of claim 15, wherein said compressing of the intensity data values comprises:
   mapping the intensity data values into intensity index values, the intensity index values identifying respective locations of the intensity data values in an intensity master table;
   forming intensity delta values, the intensity delta values identifying differences between respective neighboring pairs of intensity index values; and
   encoding the intensity delta values in compressed form, to provide the compressed intensity data values.

18. A physical and tangible computer readable medium for storing computer readable instructions, the computer readable instructions providing a decompression module when executed by one or more processing devices, the computer readable instructions comprising:

logic configured to receive a lookup request;

logic configured to determine at least one access point that is associated with the lookup request, the access point defining a point at which decoding of a stream of mass spectrometry data values commences;

logic configured to identify at least one decoding algorithm to apply in decoding the stream of mass spectrometry data values; and logic configured to decode the stream of mass spectrometry data values using said at least one decoding algorithm, starting at the access point, wherein the stream of mass spectrometry data values comprises a stream of mass-to-charge data values, or a stream of intensity data values, or an interleaved stream of mass-to-charge data values and intensity data values.

* * * * *